US012586884B2

(12) United States Patent
Kamal et al.

(10) Patent No.: US 12,586,884 B2
(45) Date of Patent: Mar. 24, 2026

(54) SIGNAL AMPLIFYING JOSEPHSON JUNCTION TRANSMISSION LINE

(71) Applicant: University of Massachusetts, Boston, MA (US)

(72) Inventors: Archana Kamal, Lowell, MA (US); Chung S. Kow, Lowell, MA (US); Tristan B. Brown, Lancaster, MA (US)

(73) Assignee: University of Massachusetts, Boston, MA (US)

( * ) Notice: Subject to any disclaimer, the term of this patent is extended or adjusted under 35 U.S.C. 154(b) by 238 days.

(21) Appl. No.: 18/393,432

(22) Filed: Dec. 21, 2023

(65) Prior Publication Data

US 2025/0015472 A1     Jan. 9, 2025

Related U.S. Application Data

(60) Provisional application No. 63/477,046, filed on Dec. 23, 2022.

(51) Int. Cl.
*H03K 17/92*     (2006.01)
*H01P 3/00*     (2006.01)

(52) U.S. Cl.
CPC ............. *H01P 3/003* (2013.01); *H03K 17/92* (2013.01)

(58) Field of Classification Search
CPC ...................................................... H03K 17/92
USPC ................................................. 327/527, 528
See application file for complete search history.

(56) References Cited

U.S. PATENT DOCUMENTS

2023/0163762 A1*  5/2023  Yamaji ................... H03B 27/00
                                                             327/528
2023/0216495 A1*  7/2023  Yamaji ................... G06N 10/00
                                                             327/528

OTHER PUBLICATIONS

Bell, M. T., et al., "Traveling-Wave Parametric Amplifier Based on a Chain of Coupled Asymmetric SQUIDs", Physical Review Applied, Aug. 21, 2015, pp. 024014-1-024014-9.
Grimsmo, Arne L., et al. "Quantum Metamaterial for Broadband Detection of Single Microwave Photons", Physical Review Applied 15, Mar. 25, 2021, pp. 034074-1-034074-13.
Macklin, C., et al., "A near-quantum-limited Josephson traveling-wave parametric amplifier", Oct. 16, 2015, vol. 350, Issue 6258, pp. 307-310.
Miano, Alessandro, et al., "Symmetric Traveling Wave Parametric Amplifier", IEEE Transactions on Applied Superconductivity, vol. 29, No. 5, Aug. 2019, pp. 1-6.
O'Brien, Kevin, et al., "Resonant Phase Matching of Josephson Junction Traveling Wave Parametric Amplifiers", Physical Review Letters, Oct. 6, 2014, pp. 157001-1-157001-5.
Ranadive, Arpit, et al., "Kerr reversal in Josephson meta-material and traveling wave parametric amplification", Nature Communications, Apr. 1, 2022, pp. 1-9.

(Continued)

*Primary Examiner* — Tomi Skibinski
(74) *Attorney, Agent, or Firm* — Armis IP Law, LLC

(57)     ABSTRACT

A transmission line as discussed herein includes: an input node operative to receive input derived from a primary signal and a pump signal; an output node operative to output an output signal; and circuitry disposed in a circuit path extending between the input node and the output node, the circuitry including a first Josephson junction component coupled between the circuit path and a reference voltage node, the circuitry operative to amplify the primary signal to produce the output signal.

20 Claims, 21 Drawing Sheets

(56)       References Cited

OTHER PUBLICATIONS

White, T.C., "Traveling wave parametric amplifier with Josephson junctions using minimal resonator phase matching", Applied Physics Letters 106, 242601, Jun. 15, 2015, pp. 24601-1-24601-5.

Yaakobi, O., et al., "Parametric amplification in Josephson junction embedded transmission lines", Physical Review B87, 144301, Apr. 1, 2013, pp. 144301-1-144301-9.

Yaakobi, Oded, et al., "Erratum: Parametric amplification in Josephson junction embedded transmission lines", Physical Review B 88, Dec. 11, 2013, pp. 219904-1-219904-2.

* cited by examiner

1

SIGNAL AMPLIFYING JOSEPHSON JUNCTION TRANSMISSION LINE

RELATED APPLICATION

This application claims the benefit of earlier filed U.S. Patent Application Ser. No. 63/477,046 entitled "SELF PHASE-MATCHED BROADBAND AMPLIFICATION WITH A LEFT-HANDED JOSEPHSON TRANSMISSION LINE,", filed on Dec. 23, 2022, the entire teachings of which are incorporated herein by this reference.

BACKGROUND

Josephson Parametric Amplifiers (JPA) are used in microwave signal processing, enabling applications ranging from qubit readout, real-time quantum feedback, quantum metrology, to quantum sensing. Conventional JPA designs, based on Josephson junction(s) integrated in a resonant circuit, realize standing wave amplification at a fixed frequency; while ease of design of such amplifiers have made them a standard functionality in microwave measurements, such lumped-element designs are typically limited to relatively small instantaneous bandwidths and dynamic range (input signal powers for which amplification remains linear). There have been numerous proposals in recent years based on impedance engineering, nonlinearity engineering and coherent feedback via auxiliary modes, that can partially alleviate this issue; however, the ultimate amplification bandwidth, and concomitant saturation input powers, in such modified-JPA designs are still limited by the bare resonance linewidth of the signal mode.

A compelling alternative to standing-wave JPAs are Josephson Traveling Wave Parametric Amplifiers (JTWPA) that incorporate Josephson nonlinearity in a waveguide or transmission line geometry. Unlike the lumped-element JPA circuits, the distributed nonlinearity of J-TWPA involves no resonating structures and thus, in principle, realizes much larger gain-bandwidth products. In addition to realizing broadband gain, TWPAs have the desirable property of unilateral amplification since only signals co-propagating (and hence phase matched) with the pump waves are amplified efficiently. This allows TWPAs to implement a natural separation of input and output channels, without involving any channel separation devices such as circulators or isolators that rely on external magnetic fields. Owing to this amenability and potential promise for integrated and scalable multiplexing, several theoretical and experimental approaches for realizing high-efficiency JTWPAs have been explored, with the primary candidates being (i) engineered metamaterials based on arrays of Josephson junctions, and (ii) nonlinear materials utilizing kinetic inductance of superconducting nanowires.

Nonetheless, the very feature of phase matching that bestows TWPAs with their inherently non-reciprocal gain, also turns out to be the key challenge in the way of realizing gain over large propagation distances and device geometries. This is because the presence of strong Josephson nonlinearity makes the effective refractive index, and hence the phase difference between interacting signal and pump waves, intensity-dependent. Furthermore, since the signal amplitude scales with distance due to amplification, it becomes challenging to compensate for phase mismatch due to both linear and nonlinear dispersion between different propagating frequencies throughout the propagation distance. Inspired by ideas used in traveling-wave fiber-optic amplifiers, recent studies have explored solutions such as dispersion engineering of J-TWPAs, that is rooted in modifying linear dispersion of the bare (unpumped) line to compensate for the nonlinear phase mismatch in the presence of the pump. Variations on this theme based on impedance engineering and nonlinearity engineering also remain an area of active research.

BRIEF DESCRIPTION

In this disclosure, we present a simple J-TWPA design based on 'left-handed' (negative-index) nonlinear Josephson metamaterial, which realizes autonomous phase matching without the need for any complicated circuit or dispersion engineering. The resultant efficiency of four-wave mixing process can implement gains in excess of 20 dB over few GHz bandwidths in this work with much shorter lines than previous implementations. Furthermore, the autonomous nature of phase matching considerably simplifies the J-TWPA design than previous implementations based on 'right-handed' (positive index) Josephson metamaterials, making the proposed architecture particularly appealing from a fabrication perspective. The left-handed JTL introduced here constitutes a new modality in distributed Josephson circuits, and forms a crucial piece of the unified framework that can be used to inform the optimal design and operation of broadband microwave amplifiers.

In this disclosure, we propose a novel and simple design based on left-handed Josephson metamaterial that can realize low-noise broadband amplification without any need for complicated nonlinearity or dispersion engineering. The operation of a left-handed J-TWPA as a broadband amplifier as discussed herein is rooted in the compensation of linear dispersion-induced phase mismatch between signal (idler) and pump waves with nonlinearity-induced phase mismatch, an effect enabled by opposing directions of phase and group velocities in a left-handed transmission line.

While left-handed transmission lines have been explored in linear optical applications, such as subwavelength focusing and resonance cone formation, their potential as nonlinear media for wave mixing has remained largely unexplored. Specifically, left-handed Josephson transmission lines (JTLs) constitute a new modality in microwave superconducting circuits, where all designs explored to date employ right-handed transmission lines embedded with Josephson junctions. As depicted in FIG. 1, left-handed JTLs effectively double the engineering landscape for J-TWPAs, introducing new operational regimes such as the 'reversed dispersion' [(e) in FIG. 1], which can be leveraged in combination of non-degenerate pumping for achieving a flat gain profile over a wide frequency range.

More specifically, an apparatus as discussed herein includes: an input node operative to receive input derived from a primary signal and a pump signal; an output node operative to output an output signal; and circuitry disposed in a circuit path extending between the input node and the output node, the circuitry including a first Josephson junction component coupled between the circuit path and a reference voltage node, the circuitry operative to amplify the primary signal to produce the output signal.

In one example, the primary signal inputted to the input node is operative to modulate the pump signal to produce the input signal, the pump signal being a carrier frequency.

In accordance with further examples, the circuitry as discussed herein can be configured to include multiple capacitor components disposed in series in the circuit path extending between the input node and the output node. The multiple capacitor components may include a first capacitor component and a second capacitor component. The circuit path can be configured to include a first node coupling the first capacitor component and the second capacitor component. The first Josephson junction component may be connected between the first node and the reference voltage node.

As further discussed herein, the apparatus such as a transmission line as discussed herein may include a second Josephson junction component or any number of Josephson junction components. The circuit path associated with a transmission line can be configured to include a second node coupling the second capacitor component to a third capacitor component of the multiple capacitor components disposed in series in the circuit path. In such an instance, the second Josephson junction component is coupled between the second node and the reference voltage node.

Yet further, a transmission line as discussed herein can be configured to include a first capacitor component disposed in series in the circuit path between the input node and the output node.

Still further, the input node as discussed herein may be a first input node and the output node may be a first output node associated with the transmission line. The transmission line can be configured to include a second circuit path extending between a second input node and a second output node of the transmission line. The second circuit path may be or represent the reference voltage node associated with the circuitry and corresponding transmission line.

Yet further, examples herein include a system comprising: a directional coupler operative to receive a first signal and a second signal, the directional coupler operative to generate a third signal based on the first signal and the second signal; a transmission line including an input node and an output node, the input node of the transmission line coupled to the directional coupler to receive the third signal; and wherein the transmission line includes circuitry disposed in a circuit path extending between the input node and the output node, the circuitry including a first Josephson junction component coupled between the circuit path and a reference voltage node, the circuitry operative to amplify the first signal into a fourth signal outputted from the output node.

Note further that the system as discussed herein can be configured to include a first pump device operative to produce the second signal; the second signal may be a pump signal. Additionally, the directional coupler can be configured to provide coupling between the first signal and the second signal to generate the third signal. The first signal can be used to modulate the second signal to produce the third signal.

Yet further, the system as discussed herein can be configured to include a first pump device operative to produce a fifth signal (such as a first pump signal). The system as discussed herein can be configured to include a second pump device operative to produce a sixth signal (such as a second pump signal). The system as discussed herein can be configured to include a combiner operative to produce the second signal based on the fifth signal and the sixth signal.

Still further, the first pump device as discussed herein can be configured to produce the fifth signal at a first frequency; the second pump device can be configured to produce the sixth signal at a second frequency. In one example, the second frequency is greater than the first frequency. A zero dispersion frequency associated with the transmission line may be centered about the first frequency and the second frequency. In other words, the first frequency of the second frequency can be selected based upon the zero dispersion frequency associated with the transmission line.

In further examples, the transmission line as discussed herein is operative to amplify the first signal by a first gain function in a first frequency range; the first frequency and the second frequency may fall within the first frequency range. A respective minimum magnitude and a respective maximum magnitude of gain applied by the gain function in the first frequency range may vary by less than 3 decibels or other suitable amount. In one example, the magnitude of the gain associated with the first gain function in the frequency range is substantially the same or constant. The magnitude of the first frequency range is at least 5 times greater (or any suitable amount greater) than a difference between the second frequency and the first frequency.

Yet further examples as discussed herein include a method comprising: receiving an input at an input node of a transmission line, the input being a pump signal modulated with a primary signal; via circuitry disposed in a circuit path between the input node and an output node of the transmission line, amplifying the primary signal to produce an output signal, the circuitry including a first Josephson junction component coupled between the circuit path and a reference voltage node of the transmission line; and outputting the output signal from the output node.

Yet further examples as discussed herein include an apparatus comprising: an input node operative to receive input derived from a primary signal and a pump signal; an output node operative to output an output signal; and circuitry disposed in a transmission line between the input node and the output node, the circuitry including a capacitor component disposed in series in a circuit path between the input node and the output node, the circuitry operative to amplify the primary signal to produce the output signal.

In one embodiment, the primary signal inputted to the input node is operative to modulate the pump signal to produce the input signal, the pump signal being a carrier frequency.

In still further examples, the circuitry as discussed herein includes multiple capacitor components disposed in series in the circuit path extending between the input node and the output node. The capacitor component may be a first capacitor component. The multiple capacitor components as discussed herein may include the first capacitor component and a second capacitor component.

The apparatus further may include a first Josephson junction component.

Yet further examples of the apparatus as discussed herein include: a reference voltage node. The circuit path may include a first node coupling the first capacitor component and the second capacitor component; the first Josephson junction component may be coupled between the first node and the reference voltage node.

Still further, the apparatus as discussed herein may include a second Josephson junction component. The circuit path may include a second node coupling the second capacitor component to a third capacitor component of the multiple capacitor components disposed in series in the circuit path. Additionally, the second Josephson junction component may be coupled between the second node and the reference node.

Still further, the circuitry of the apparatus as discussed herein may include a first shunt component; the first shunt component includes a first terminal and a second terminal. The first terminal of the first shunt component may be connected to the circuit path; the second terminal of the first shunt component may be connected to a reference voltage node. Yet further, as discussed herein, the first shunt component can be configured to include insulator material disposed between first superconductive material and second superconductive material.

In accordance with still further examples as discussed herein, the circuit path and the transmission line may be a first circuit path of the transmission line extending between the input node and the output node. The apparatus and corresponding transmission line may further include a second circuit path. The second circuit path represents or is coupled to a reference voltage. The capacitor component in the first circuit path is operative to provide capacitive coupling between a first portion of the first circuit path and a second portion of the first circuit path.

Yet further, the apparatus as discussed herein may include a first shunt component including insulator material disposed between first superconductive material and second superconductive material. The first superconductive material may be electrically coupled to the first portion of the first circuit path; the second superconductive material may be electrically coupled to the second portion of the second circuit path.

As discussed herein, techniques herein are well suited to more effectively amplify signals in a transmission line. However, it should be noted that embodiments herein are not limited to use in such applications and that the techniques discussed herein are well suited for other applications as well.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of examples herein (BRIEF DESCRIPTION) purposefully does not specify every example and/or incrementally novel aspect of the present disclosure or claimed invention(s). Instead, this brief description only presents general examples and corresponding points of novelty over conventional techniques. For additional details and/or possible perspectives (permutations) of the invention(s), the reader is directed to the Detailed Description section (which is a summary of examples) and corresponding figures of the present disclosure as further discussed below.

Figures 1A, 1E:
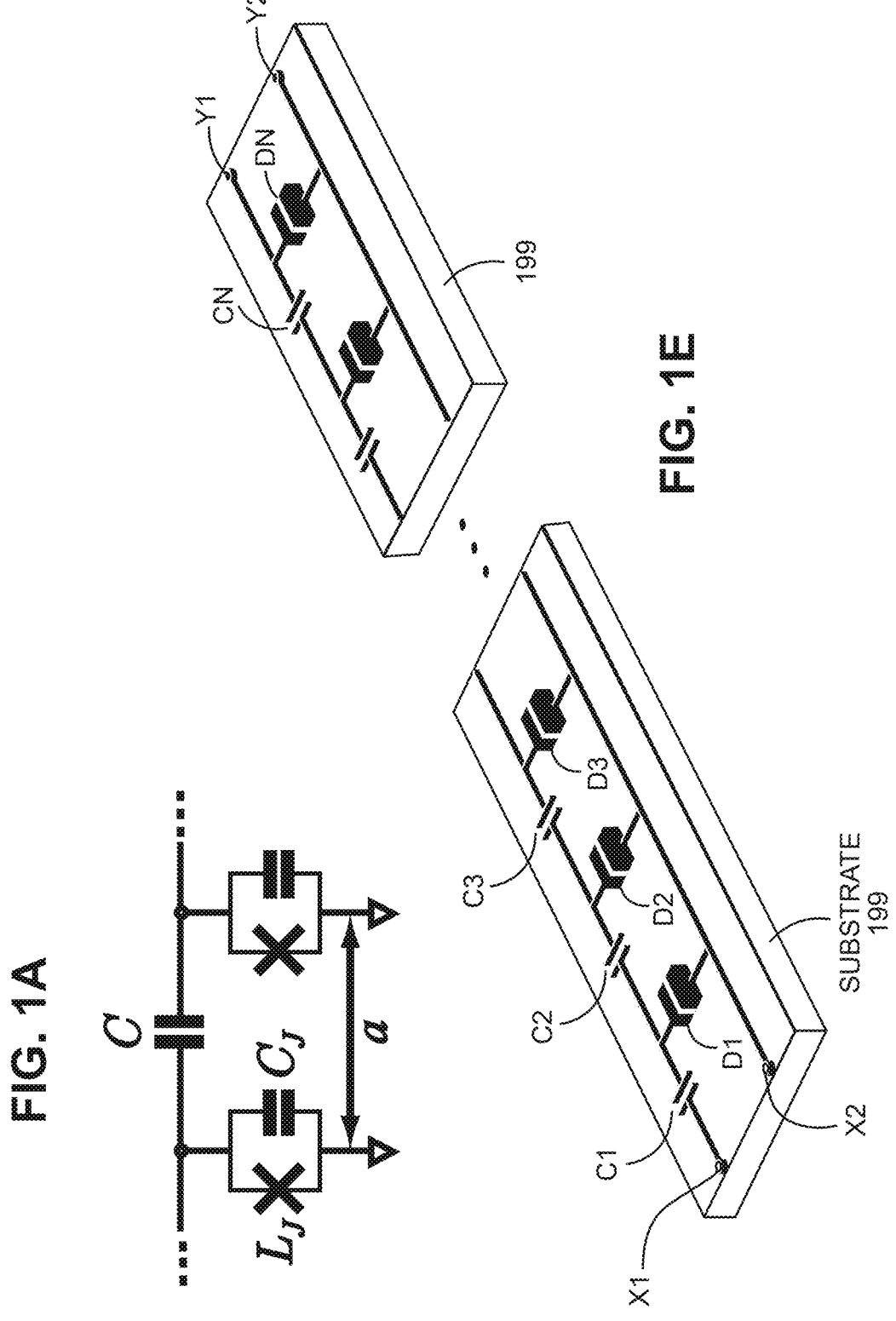
FIG. 1A is an example diagram illustrating a unit cell associated with a transmission line as discussed herein.
FIG. 1E is an example 3-dimensional diagram illustrating a signal amplifying transmission line including multiple unit cells as discussed herein.

The foregoing and other objects, features, and advantages of the invention will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

FURTHER DESCRIPTION OF EMBODIMENTS

FIG. 1A is an example diagram illustrating a unit cell associated with a transmission line as discussed herein.

Figures 1B, 1C, 1D:
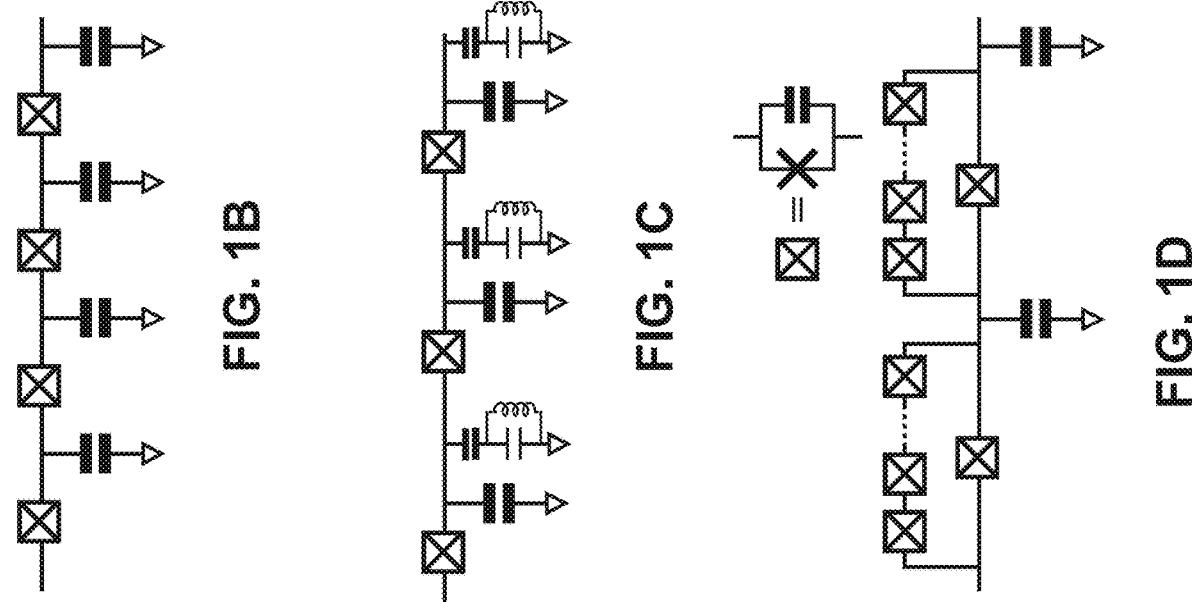
FIGS. 1B, 1C, and 1D, illustrate conventional transmission line circuitry as discussed herein.

FIGS. 1B, 1C, and 1D, illustrate conventional transmission line circuitry as discussed herein.

FIG. 1E is an example 3-dimensional diagram illustrating a signal amplifying transmission line including multiple unit cells as discussed herein.

Figure 1F:
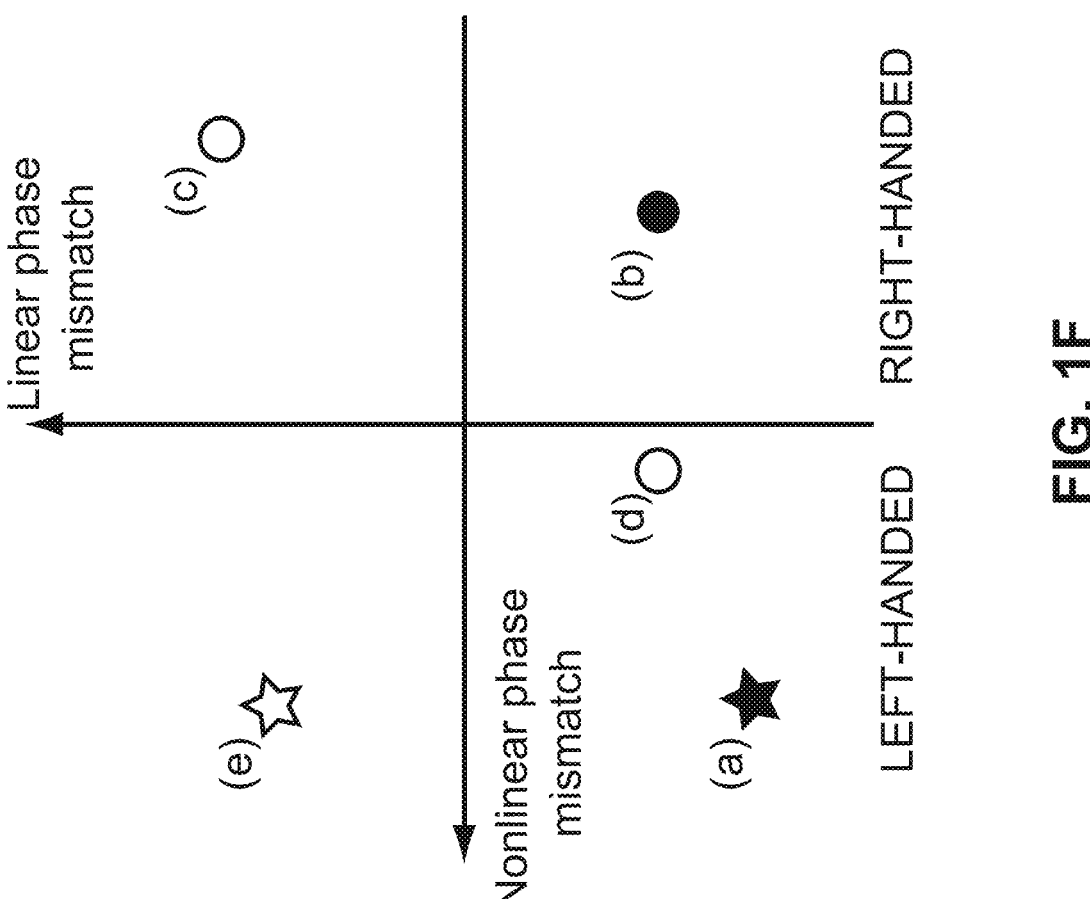
FIG. 1F is an example graph illustrating operation of different types of transmission lines and corresponding circuitry as discussed herein.

FIG. 1F is an example graph illustrating operation of different types of transmission line and corresponding circuitry as discussed herein.

Landscape of J-TWPA devices. The circles in FIG. 1F represent a transmission line design based on right-handed Josephson transmission lines (such as shown in FIGS. 1B, 1C, and 1D) while the stars denote the left-handed JTL represent designs proposed in this work. Filled symbols denote the 'bare' right- and-lefthanded J-TWPAs, while corresponding empty symbols indicate variations based on either linear or nonlinear phase engineering. The shaded quadrants show the regions where efficient amplification is not possible due to the linear and nonlinear dispersions having the same sign. FIG. 1A is a schematic of a left-handed Josephson transmission line (JTL): each unit cell of length a consists of a capacitance in series C, along with a Josephson junction acting as an inductive shunt to ground with junction inductance and capacitance denoted with $L_J$ and $C_J$ respectively. In the presence of a strong pump wave, a small probe signal injected at the input gets amplified as it travels down the JTL. Representative conventional circuit designs of right-handed J-TWPAs are shown in panels in FIGS. 1B, 1C, and 1D, along with respective references.

II. EQUATION OF MOTION FOR LEFT-HANDED J-TWPA

As shown in FIGS. 1A and 1E, the primary difference between a left-handed Josephson transmission line (JTL) and the previous TWPAs designs (FIGS. 1B, 1C, and 1D) based on right-handed JTL is the exchange of the inductive ($L_J$) and capacitive (C) elements to be the parallel and series impedance elements in the transmission line respectively. The additional shunt capacitance $C_J$ denotes the intrinsic Josephson capacitance. The corresponding linear dispersion relation for the line is given by the graph is shown in FIG. 2A, $$k_m = \frac{\omega_0\sqrt{1 - \omega_m^2/\omega_J^2}}{a\omega_m}, \tag{1}$$

where a denotes the size of a unit cell, $\omega_m$ is the frequency of the propagating wave, $\omega_J = 1/\sqrt{L_J C}$ is the Josephson plasma frequency that sets the cut-off frequency of the JTL waveguide, and $\omega_0 = 1/\sqrt{L_J C}$ is frequency corresponding to $k_m a = 1$. It is worthwhile to note that in a left-handed JTL the directions of wave and energy propagation are anti-parallel, given the sign difference between the wave and group velocities, $$v_w(\omega_m) = \frac{a\omega_m^2}{\omega_0\sqrt{1 - \omega_m^2/\omega_J^2}} \approx \frac{a\omega_m^2}{\omega_0} > 0, \tag{2a}$$

$$v_g(\omega_m) = -\frac{a\omega_m^2\sqrt{1 - \frac{\omega_m^2}{\omega_J^2}}}{\omega_0} \approx -v_w(\omega_m) < 0. \tag{2b}$$

Figure 2A:
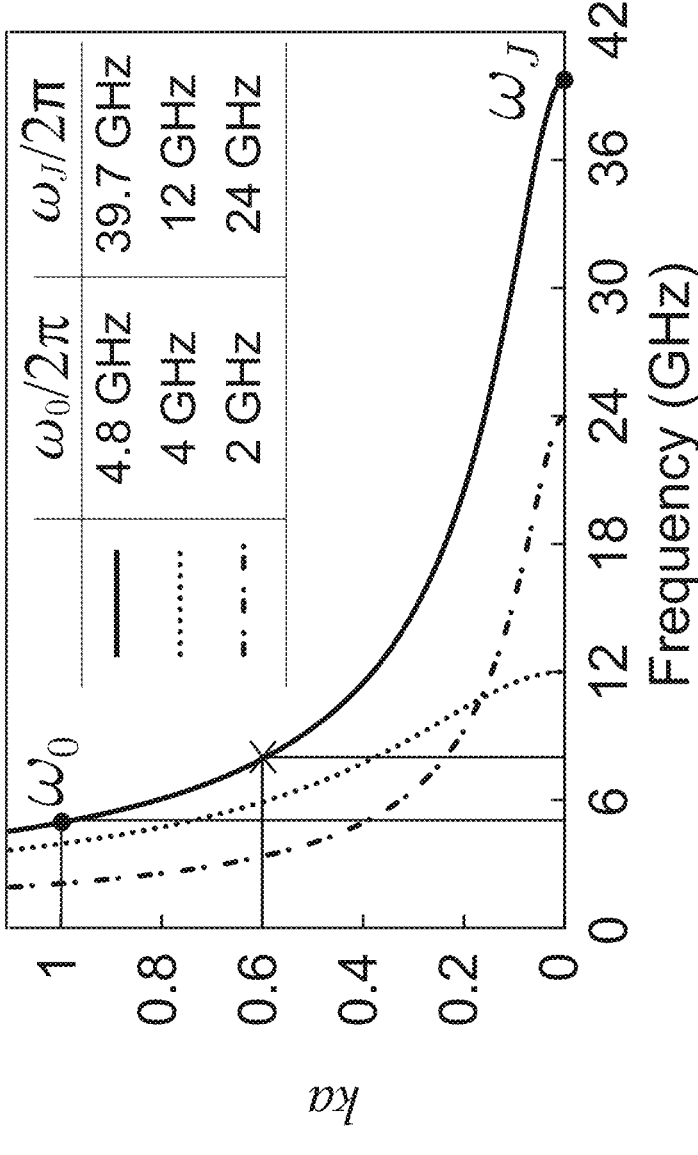
FIG. 2A is an example diagram illustrating a corresponding dispersion relation for a left-handed transmission line as discussed herein.
Figure 2B:
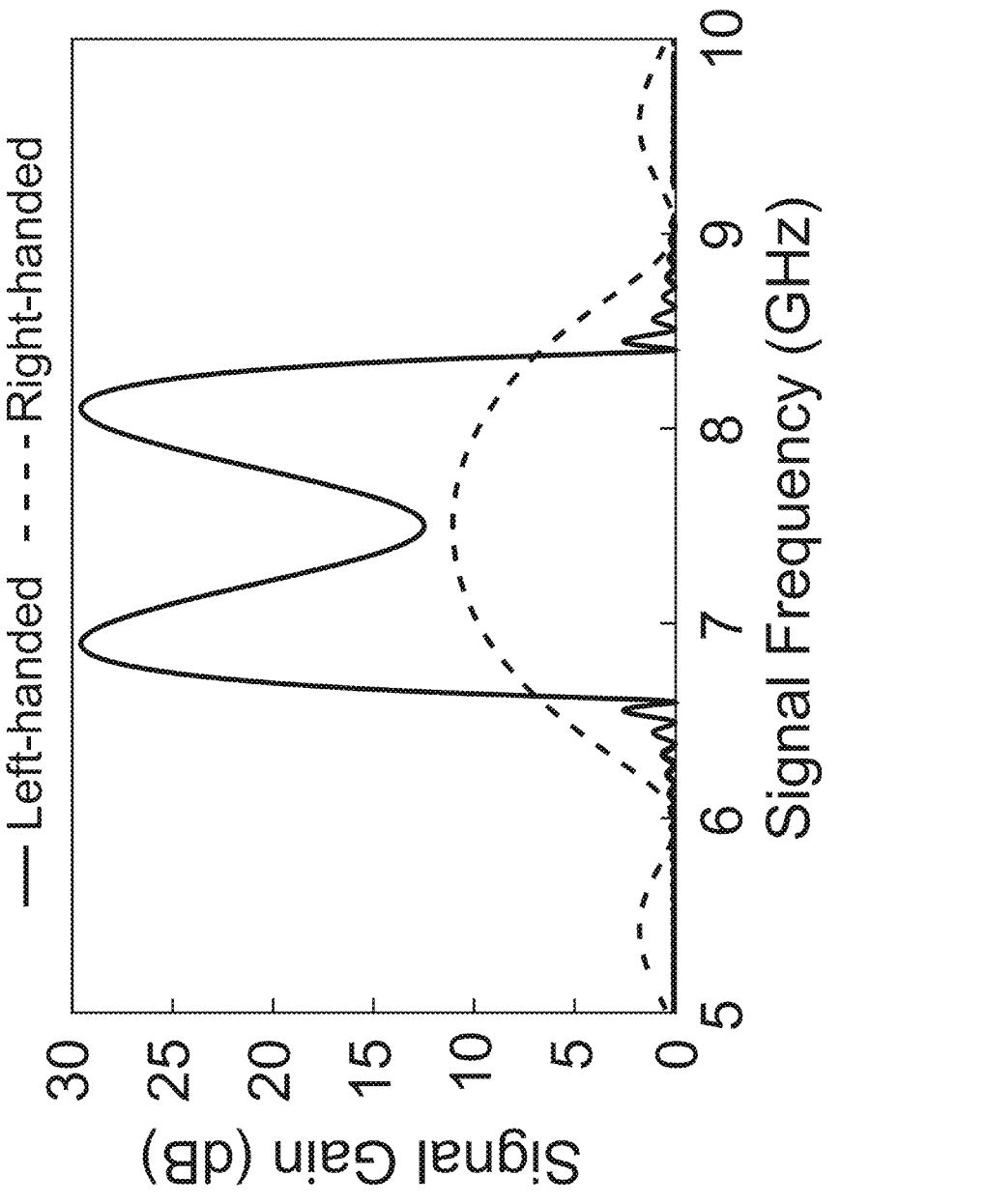
FIG. 2B is an example comparison of frequency dependent gain between a left-handed transmission line and right-handed transmission line as discussed herein.

FIG. 2A is an example diagram illustrating a dispersion relation for a left-handed JTL shown for three different choices of ($\omega_J, \omega_0$). The position of the cross denotes the choice of pump frequency, corresponding to wave vector ka=0.6, used for the calculations presented in the following panels. FIG. 2B is an example diagram illustrating comparison of frequency-dependent gain between left-handed (l=1000a) and right-handed (l=2000a) J-TWPAs [FIGS. 1A-1B]. The circuit parameters used for the left-handed J-TWPA are $L_J$=1670 pH, $C_J$=9.6 fF, C=667 fF, while those for the right-handed J-TWPA are $L_J$=100 pH, $C_J$=329 fF, C=39 fF. For both calculations, $\omega_p/2\pi$=7.5 GHZ, a=10 µm, $I_p$=0.5 $I_0$, and $Z_c = L_J/C$=50Ω were used. The peak gain of 30 dB (11 dB) is realized at relative detuning of $\delta^{max}$=0.6 ($\delta^{max}$=0) in the left-handed (right-handed) design. (c) Comparison of frequency-dependent wave vector mismatch between the left-handed (left) and right-handed (right) J-TWPAs.

II.A. Linear Amplification

In order to derive the wave equation for a left-handed JTL, we expand the Josephson cosine potential and retain only the leading order nonlinear term. Such a 'perturbative' approach is reasonable to describe the regime of linear amplification, when the current flowing through the junction remains small as compared to the critical current of the junction ($I_0$). This leads to the following equation of motion for the for the propagating field amplitude, described in terms of the position-dependent flux variable $\phi(x,t)$ (as further discussed below as well), $$C_J\frac{\partial^2\phi(x,t)}{\partial t^2} - Ca^2\frac{\partial^4\phi(x,t)}{\partial x^2\partial t^2} + \frac{\phi(x,t)}{L_J} - \frac{\phi^3(x,t)}{6I_0^2 L_J^3} = 0. \tag{3}$$

The first three terms in Eq. (3) describe the linear propagation, while the fourth term describes the nonlinear frequency mixing. It is worth noting that the nonlinearity appears directly in the flux amplitude (i.e. potential energy) here, unlike the right-handed J-TWPA where the nonlinearity appears in the kinetic energy term as $(\partial^2\phi/\partial x^2)(\partial\phi/\partial x)^2$. In order to derive linear amplification response of the left-handed JTL, we then develop the solution of the form $$\phi(x, t) = \sum_{m\in\{p,s,i\}} \frac{A_m(x)}{2}e^{i(k_m x - \omega_m t)} + c.c. \tag{4}$$

where m∈{p,s,i} indexes the pump, signal and idler waves respectively. Note that in contrast to previous theoretical proposals considering nonlinear optics of bulk metamaterials; all three waves supported by the left-handed J-TWPA have negative group velocity. Performing harmonic balance dictated by energy conservation in the four-wave mixing process (2 $\omega_p = \omega_s + \omega_i$), and solving the resultant coupled system of equations leads to the following expression for signal/idler amplitudes (see further discussion below), $$\tilde{A}_{s,i}(x) = \left\{\sqrt{G_c}\,e^{-i\phi}\tilde{A}_{s,i}(0) + \sqrt{G_t}\,\tilde{A}_{i,s}(0)\right\}e^{i\Delta k/2}. \tag{5}$$

Here $G_c$ and $G_t$ represent the cis- and trans-gain of the amplifier respectively, $$G_c(x) = 1 + \sinh^2(gx)\left(1 + \left(\frac{\Delta k}{2g}\right)^2\right), \tag{6a}$$

-continued $$G_t(x) = \left(\frac{\beta_{s,i}}{g}\right)^2 \sinh^2(gx),$$   (6b)

$$\phi = \tan^1\left(\frac{\Delta k}{2g}\tanh(gx)\right),$$   (6c)

with $g=\beta_s\beta_i{}^*-(\Delta k/2)^2$ denoting the gain per unit length of the amplifier, $\beta_{s,i}$ being the nonlinear coupling per unit length for signal and idler waves, and $\Delta k$ being the total wave vector mismatch between the wave propagating at pump frequency and a fixed signal (idler) frequency.

Figure 2C:
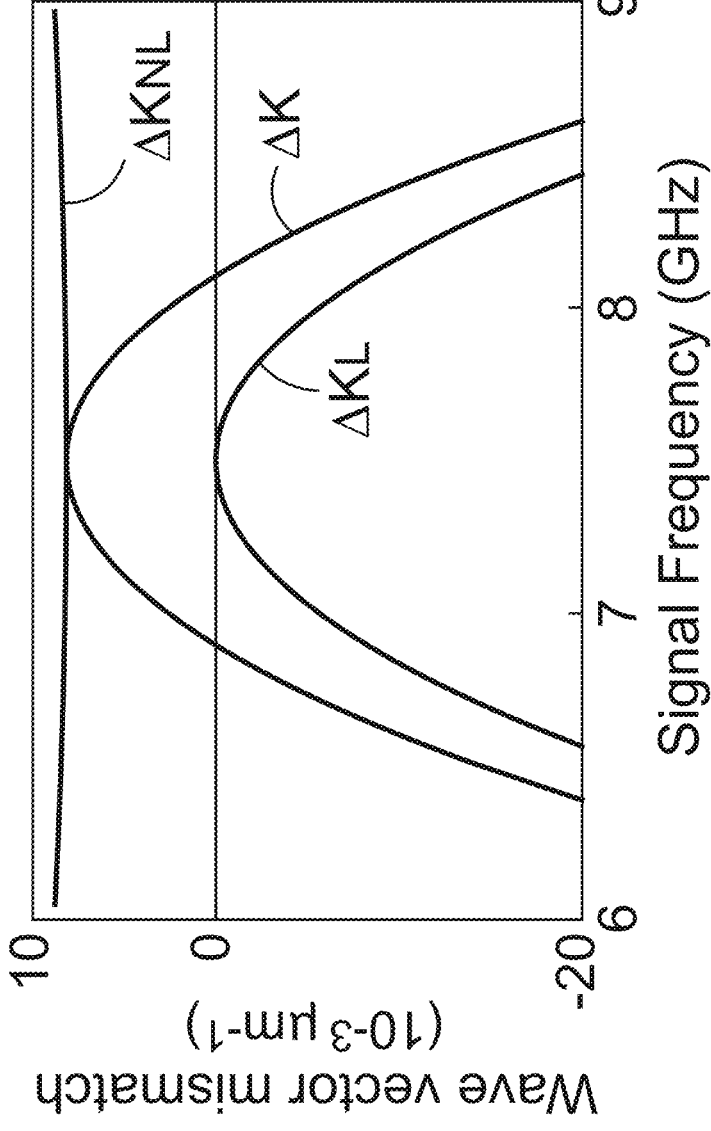
FIG. 2C is an example diagram illustrating comparison of frequency-dependent wave vector mismatch between a left-handed transmission line and a right-handed transmission line as discussed herein.

FIG. 2B is an example diagram contrasting $G_c(x)$ calculated for left-handed and right-handed J-TWPAs comprising 1000 and 2000 unit cells respectively, both pumped at a frequency $\omega_p/2\pi=7.5$ GHz. The stark difference in both the magnitude and profile of the frequency-dependent gain for left-vs right-handed designs is rooted in the frequency profiles of respective $\Delta k(\omega)$, which gets contributions both from the linear dispersion of the JTL $\Delta k_L(\omega)$, and the nonlinearity-induced self- and crossphase modulation of the propagating signals $\Delta k_{NL}(\omega)$, i.e. $\Delta k(\omega)=\Delta k_L(\omega)+\Delta k_{NL}(\omega)$. Notably, these two contributions are of opposite signs in a left-handed JTWPA as shown in FIG. 2C, since the signs of the $\Delta k_L(\omega)$ and $\Delta k_{NL}(\omega)$ are determined by the wave velocity $v_w(\omega)$ and group velocity $v_g(\omega)$ respectively, $$\Delta k_L(\delta)a = \left(\frac{2\omega_p}{v_w(\omega_p)} - \frac{\omega_s}{v_w(\omega_s)} - \frac{\omega_i}{v_w(\omega_i)}\right)a$$   (7a)
$$\approx -\frac{2\omega_0}{\omega_p}\left(\frac{\delta^2}{1-\delta^2}\right) < 0$$, $$\Delta k_{NL}(\delta)a = 2\rho\left(\frac{\omega_p}{v_g(\omega_p)} - \frac{\omega_s}{v_g(\omega_s)} - \frac{\omega_i}{v_g(\omega_i)}\right)$$   (7b)
$$\approx 2\rho\frac{\omega_0}{\omega_p}\left(\frac{1+\delta^2}{1-\delta^2}\right) > 0$$, where, in the second step of each equation, we have used Eqs. (2) and parametrized signal/idler frequencies in terms of a dimensionless detuning $\delta$ from the pump, $\omega_{s,i}=\omega_p(1\pm\delta)$, $-1<\delta<1$. Here, $\rho=(I_p/I_0)^2(\omega_0/4\omega_p)^2$ is the nonlinear mixing coefficient determined by the pump amplitude and frequency (see below as well). As evident from Eqs. (7), the relative sign difference between wave and group velocity in a left-handed metamaterial enables a left-handed JTWPA to be autonomously phase-matched over a broad bandwidth.

Figure 2D:
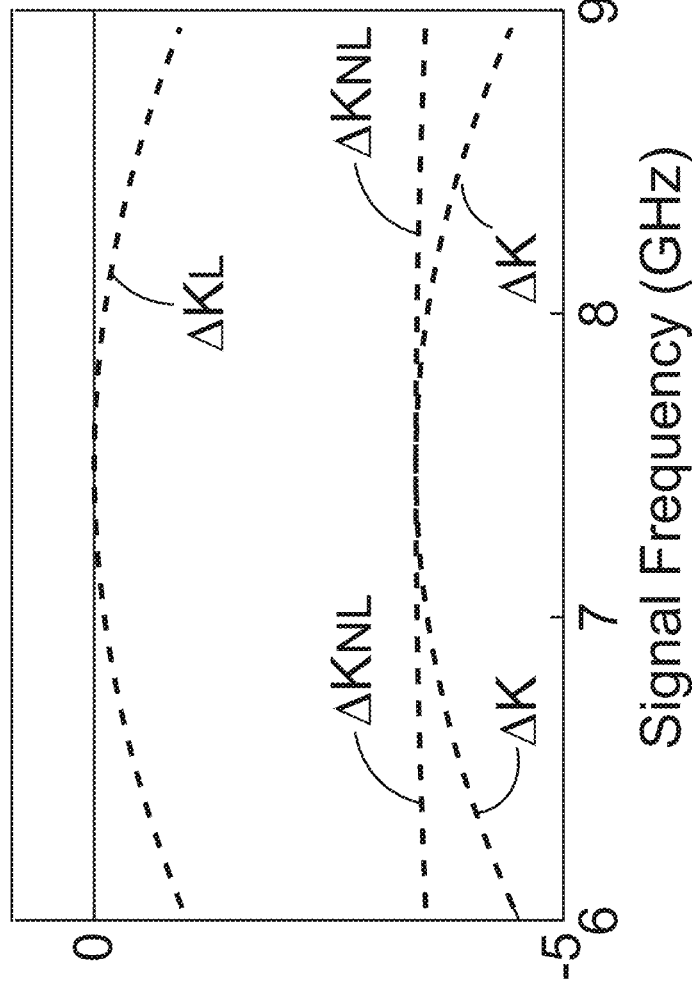
FIG. 2D is an example diagram illustrating wave vector versus frequency as discussed herein.

In contrast, in a right-handed J-TWPA both $v_w$ and $v_g$, and hence linear and nonlinear wave vector mismatch, are restricted to be of the same sign owing to the always convex dispersion of a right-handed JTL. To circumvent this issue, several approaches centered on either modifying $\Delta k_L$ or $\Delta k_{NL}$ have been explored in designs based on right-handed JTLs. Besides employing complicated design engineering, such solutions necessarily lead to other constraints. For instance, a common and widely adopted approach involves compensating the mismatch by periodically loading the line with resonant elements in order to open a band gap in $\Delta k_L$[FIG. 2D]; this, however, leads to limited frequency tunability of the J-TWPA since now the pump needs to be tuned to be near the dispersion feature to avail of the intended linear mismatch to be compensated by the nonlinear mismatch in the presence of the pump. Similarly, engineering $\Delta k_{NL}$ via SQUID-based designs require additional lines for flux control and complicated pump engineering. In contrast, the autonomous phase matching achieved in left-handed J-TWPA is free of such constraints making it easier to design and optimize. Furthermore, the resultant efficiency of the four-wave mixing process leads to a peak gain that scales exponentially with length of the line [unlike quadratic scaling in the 'bare' right-handed JTL, FIG. 1B, allowing usage of shorter lines which translates to reduced distributed loss and tighter fabrication control. Such considerations become especially crucial while evaluating prospects of J-TWPAs as sources of broadband squeezed radiation, where frequency-dependent line loss can severely limit the achievable squeezing.

II.B. Unique Features of Left-Handed J-TWPA

In addition to autonomous phase matching over broad bandwidths, there are several unique features of lefthanded J-TWPAs which we discuss in the following sections.

1. Peak Gain and Dynamic Range

For the new transmission line as shown in FIG. 1E and other FIGS. as discussed herein, the peak gain of 30 dB in FIG. 2B is realized at a frequency corresponding to a perfect wave matching condition, $\Delta k(\delta)=\Delta k_L(\delta)+\Delta k_{NL}(\delta)=0$. In view of Eqs. (7), this corresponds to a relative detuning from the center (pump) frequency, $$\delta^{max} \approx \left(\frac{\rho}{1-\rho}\right)^{1/2}.$$   (8)

Note that, unlike right-handed design, doubly degenerate condition, i.e. $\delta=0$, does not correspond to perfect phase matching in a left-handed J-TWPA. Furthermore, in the limit $\rho<<1$, the gain per unit cell at $\delta^{max}$ simplifies to $ga\approx\rho\omega_0/\omega_p=(I_p/4\,I_0)^2(\omega_0/\omega_p)^3$.

Figure 3A:
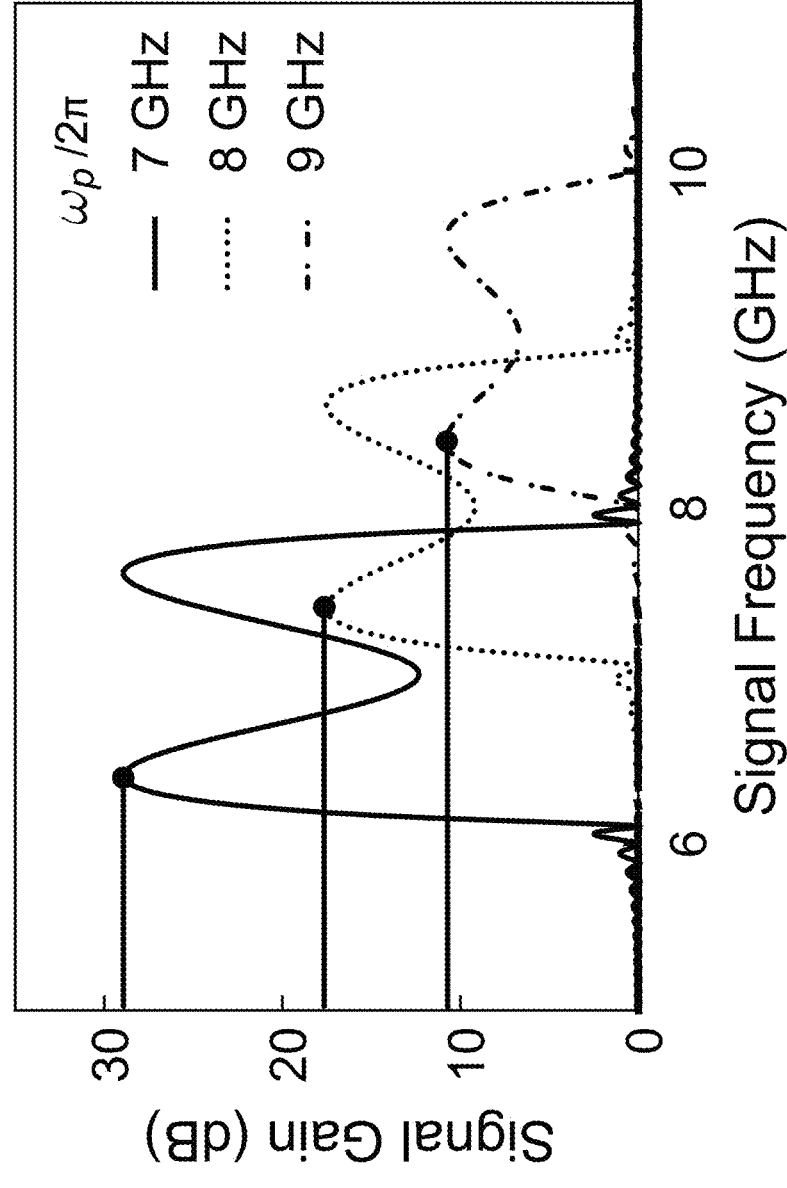
FIG. 3A is an example diagram illustrating frequency dependent gain at multiple different pump frequencies as discussed herein.

As depicted in FIG. 3A, this leads to a sharp increase in peak gain with decrease in pump frequency. This is another contrasting feature from right-handed J-TWPA, where higher gain is realized for higher pump frequencies. An advantage of this low-pass filtering property of the left-handed Josephson transmission line in FIG. 1E is the suppression of higher harmonic generation (see also below discussion). Significant engineering efforts are being expended to eliminate the intermodulation products and sidebands mediated by these higher pump harmonics, that are known to decrease quantum efficiency and effective squeezing attainable with right-handed J-TWPAs.

Figure 3B:
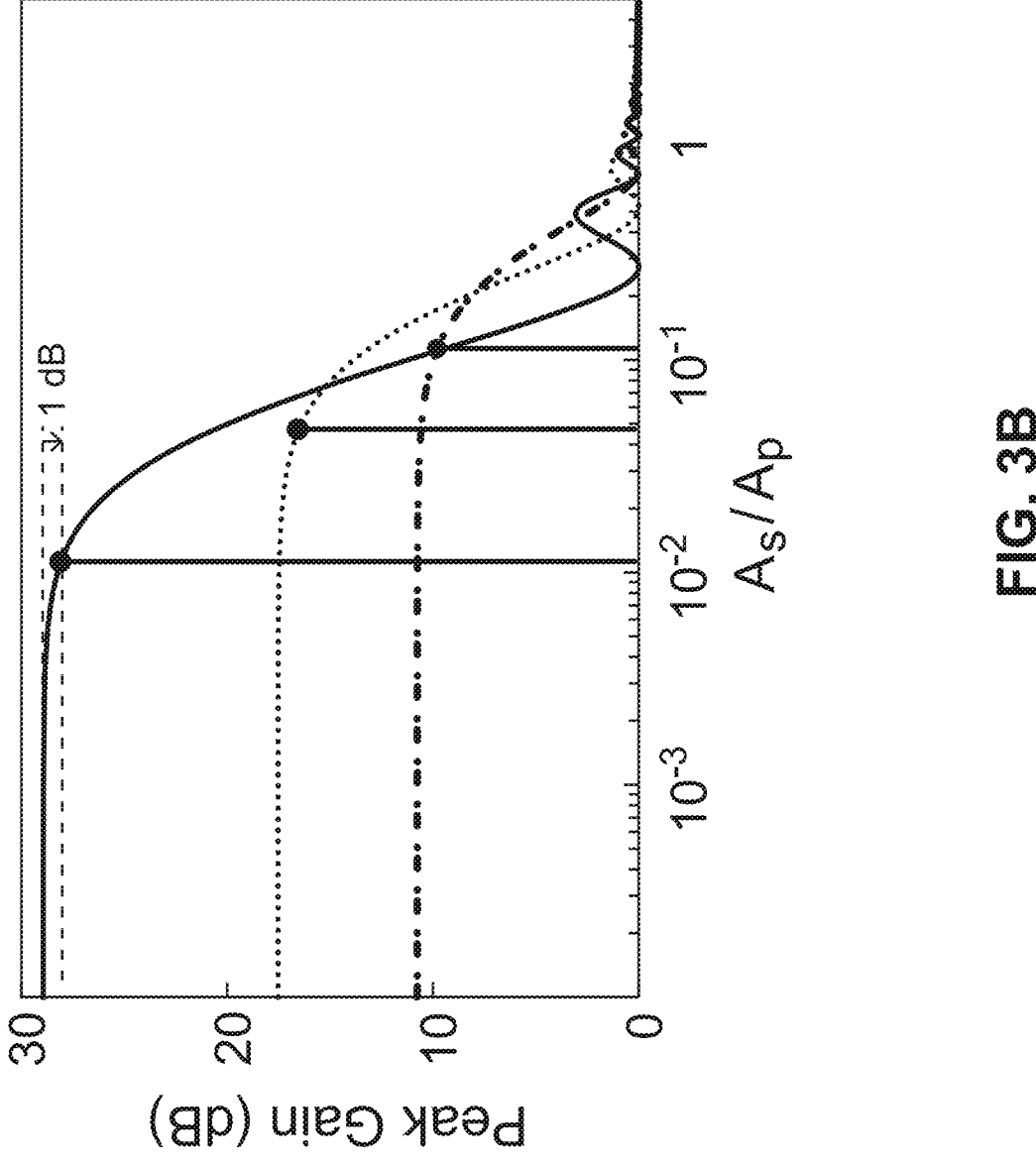
FIG. 3B is an example diagram illustrating variation of gain with a normalized input signal amplitude as discussed herein.

The analysis until now assumes a "stiff" or undepleted pump amplitude irrespective of the signal gain, which strictly holds true under small signal approximation. However, as signal amplitude increases, either at the input or due to amplification down the line, and becomes comparable to pump amplitude, the amplifier response becomes nonlinear and pump depletion effects due to signal (idler) backaction need to be considered. FIG. 3B plots the result of a calculation including these effects, showing that gain of a left-handed J-TWPA rolloff at high signal powers. Further, the gain compression sets in earlier when the same device is operated at lower pump frequencies. This is in accordance with the standard amplifier physics that higher gain leads to saturation for smaller signal powers, in conjunction with the fact that a left-handed J-TWPA realizes higher gain at lower $\omega_p$.

FIG. 3A is an example diagram illustrating frequency-dependent $G_c$, calculated for a lefthanded J-TWPA with 800 unit cells, for three different choices of pump frequencies. The rest of the circuit parameters are same as those used in FIG. 2A. Peak gains of 29 dB, 17.5 dB and 10.7 dB, estimated for $\omega_p/2\pi=7$ GHZ, 8 GHZ, and 9 GHz respectively, are highlighted with horizontal orange lines. FIG. 2B is an example diagram illustrating variation of peak gain with normalized input signal amplitude $A_s/A_p$. The orange dots indicate 1 dB gain compression on each curve; the x-intercepts indicated with vertical orange lines, $A_s/A_p$=0.011,0.046,0.12, represent the dynamic ranges for the three pump frequencies indicated in FIG. 2A.

2. Zero-Dispersion Frequency

Another feature unique to the left-handed J-TWPA is the existence of a "zero-dispersion frequency", $\omega_{ZD}$. The location of the $\omega_{ZD}$ corresponds to an inflection point of the dispersion relation, which leads to the following useful expression for its location, $\omega_{ZD}=\sqrt{2/3}\omega_J$. On the other hand a right-handed JTL, given its always-convex dispersion, cannot support a $\omega_{ZD}$.

Further, $\Delta k_L$ flips sign as pump frequency is scanned across $\omega_{ZD}$ in a left-handed J-TWPA. Since $\Delta k_{NL}$>0 in a left-handed J-TWPA, phase matching for signal frequencies in the range $\omega_{ZD}\geq\omega<\omega_J$ seems a nonstarter (Supplementary Section III)). In fact, this regime can be thought of as a perfect dual of the right-handed JTL where both $\Delta k_L$ and $\Delta k_{NL}$ were negative. Nonetheless, it is worthwhile to note that the linear dispersion also has the flattest profile near $\omega_{ZD}$ since the curvature of the dispersion curves goes to zero at $\omega_{ZD}$; this bodes well for achieving a flat broadband gain if phase matching could indeed be achieved. We show that the latter problem can be circumvented via the use of non-degenerate dual pumps as shown in FIG. 4A as well as additional discussion below.

Figures 4A, 4B:
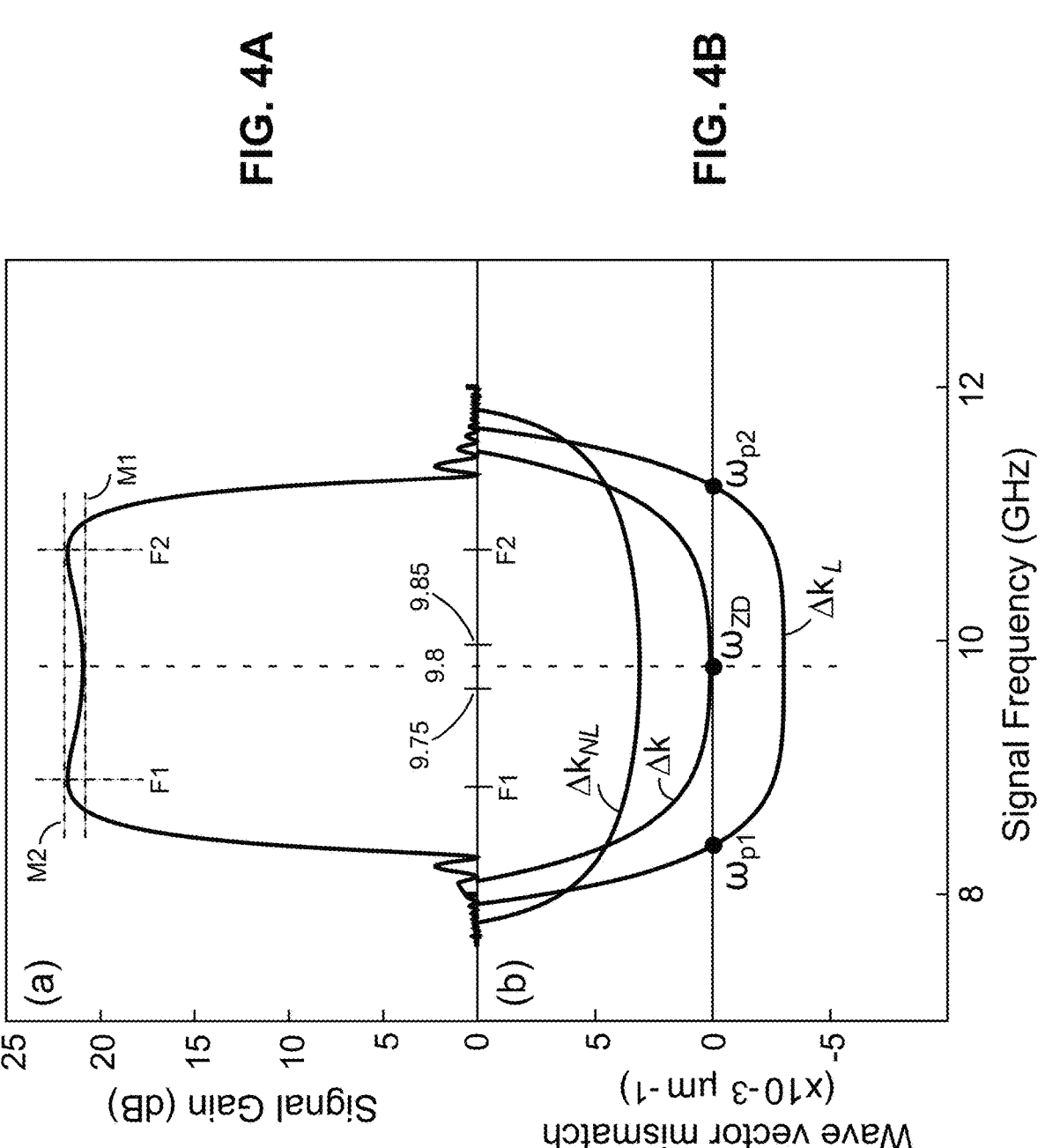
FIG. 4A is an example diagram illustrating frequency dependent gain of a transmission line based on implementation of two different pump signals as discussed herein.
FIG. 4B is an example diagram illustrating frequency dependent phase mismatch at two different pump frequencies as discussed herein.
Figure 14:
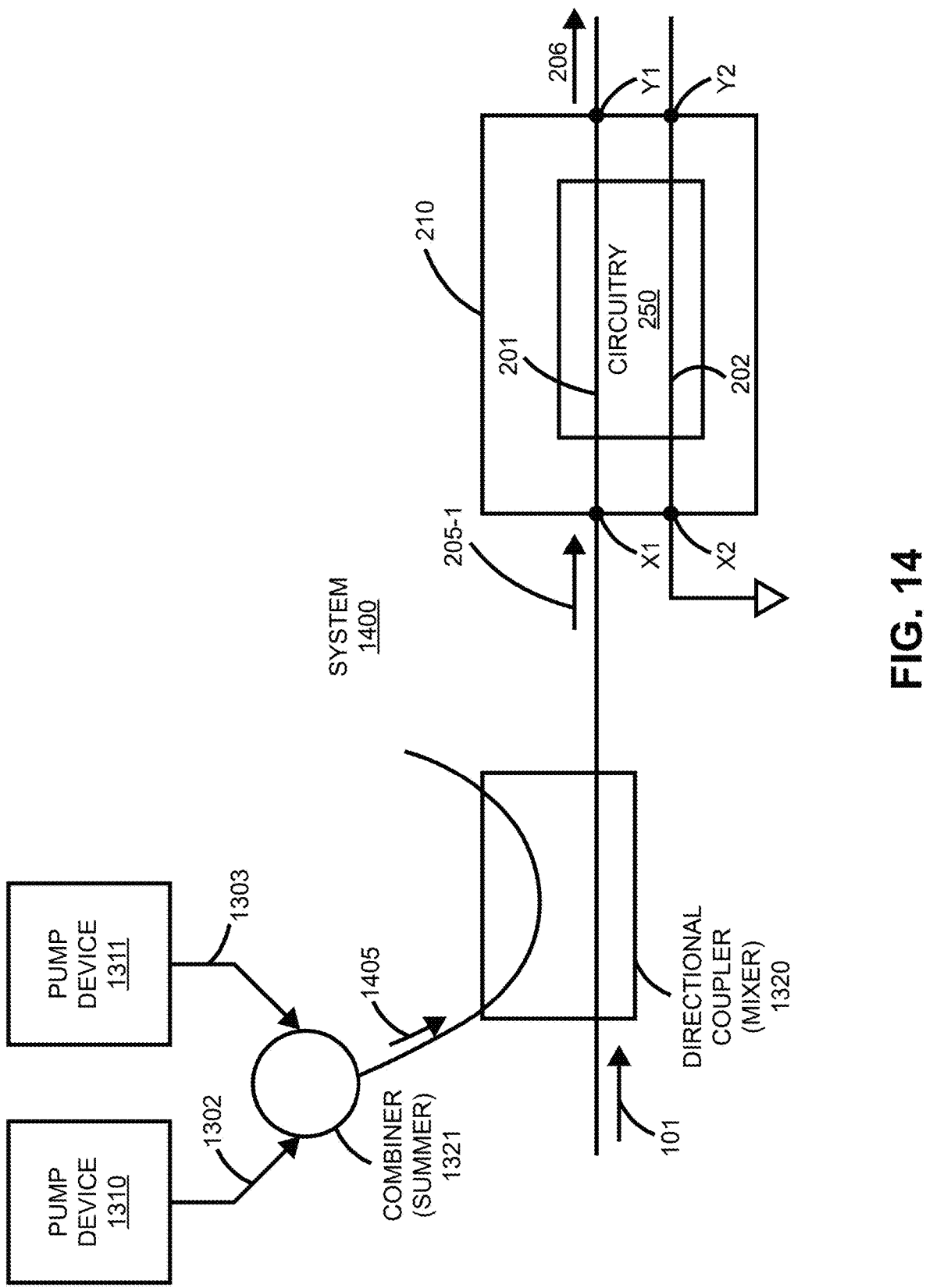
FIG. 14 is an example system diagram illustrating operation of a respective transmission line via implementation of multiple pumps as discussed herein.

As evident, a gain associated with a double-pumped left-handed J-TWPA as shown in FIG. 4A (see corresponding system as shown in FIG. 14) achieves an almost flat gain profile, realizing a gain in excess of 20 dB gain over a bandwidth of about 1.5 GHz. The flat profile of the gain achieved with non-degenerate pumping is consistent with the shape of the corresponding phase mismatch curves shown in FIG. 4B. Note that double pumping nulls the linear dispersion, $\Delta k_L$, at the two pump frequencies leading to a $\Delta k_L$<0 for $\omega_{p1}<\omega<\omega_{p2}$. Combined with a $\Delta k_{NL}$>0, this leads to a perfect wave vector match at the center frequency $\omega_{ZD}=(\omega_{p1}+\omega_{p2})/2$=9.8 GHz resulting in a flat broadband gain.

FIG. 4A is an example diagram illustrating frequency-dependent gain of a lefthanded J-TWPA with 1650 unit cells, double-pumped near $\omega_{ZD}/2\pi$=9.8 GHz with two non-degenerate pumps detuned by ±1.42 GHz. The circuit parameters correspond to the dotted dispersion curve in FIG. 2A, $L_J$=1989.4 pH, $C_J$=88.4 fF, C=795.8 fF, $I_p$=0.5 $I_0$, and $Z_c$=50$\Omega$. FIG. 4B is an example diagram illustrating frequency-dependent phase mismatch showing $\Delta k_L$=0 at the two pump frequencies $\omega_{p1}/2\pi$=8.38 GHz and $\omega_{p2}/2\pi$=11.22 GHz.

III. DISCUSSION

In summary, we have presented a left-handed J-TWPA platform which achieves low noise broadband amplification via autonomous phase matching enabled by the opposing signs of group and phase velocity in a left-handed Josephson transmission line (JTL). The simplicity of the proposed design precludes the need for any complicated circuit or nonlinearity engineering, significantly easing the fabrication of J-TWPA devices. In addition, it supports unique features such as existence of a reversed dispersion regime that can realize flat broadband gain by simply changing the operation frequency and employing non-degenerate pumps.

The principles developed in our work considerably expand the design landscape of generic traveling-wave amplifiers. Further, they provide a framework to inform design vs operational trade-offs, such as maximum gain at specific frequencies vs constant gain over wide bandwidths, in a given (right-handed vs left-handed) metamaterial platform. We elucidate this in FIG. 5 that incorporates several insights generated during the course of this research to present a unified view of several J-TWPA designs, each of which can be placed in the relevant quadrant depending on the relative sign difference between linear ($\Delta k_L$) and nonlinear ($\Delta k_{NL}$) wave vector mismatch. The aim of J-TWPA engineering is to be in the white quadrants of FIG. 5, where perfect phase matching can be realized via optimization of design and/or operation of a given device. The 'bare' left-handed J-TWPA already lies in a favorable quadrant in this plane, unlike the 'bare' right-handed J-TWPA; a potential means to move between these quadrants is to modify the nonlinear phase contribution by means of engineering the Josephson nonlinearity.

Similarly, linear phase engineering determines the movement along the y-axis, typically accomplished via either circuit engineering to modify the line dispersion or pump engineering, as discussed in the case of a lefthanded J-TWPA operated near $\omega_{ZD}$. This representation also shows how combining two approaches can be detrimental to the cause: for instance, while double-pumping a bare right-handed J-TWPA improves phase matching, double-pumping a resonantly phase-matched (RPM) version can spoil it. This is because the advantage of engineering a positive $\Delta k_L$, via an RPM-induced band gap in the line dispersion, is negated by pinning the dispersion curve to be zero near the two pump frequencies. By simple inspection, one can see that given the convex dispersion for both the right-handed JTL, and left-handed JTL below $\omega_{ZD}$, the $\Delta k_L$ is always pushed along the positive axis, while the opposite is true for a left-handed J-TWPA pumped above $\omega_{ZD}$. Thus, the diagram serves as a useful guide in understanding the landscape of distributed amplifier designs, with the arrows indicating optimal strategies to achieve efficient broadband amplification through a combination of nonlinear (x-axis) and linear (y-axis) phase engineering.

Figure 5:
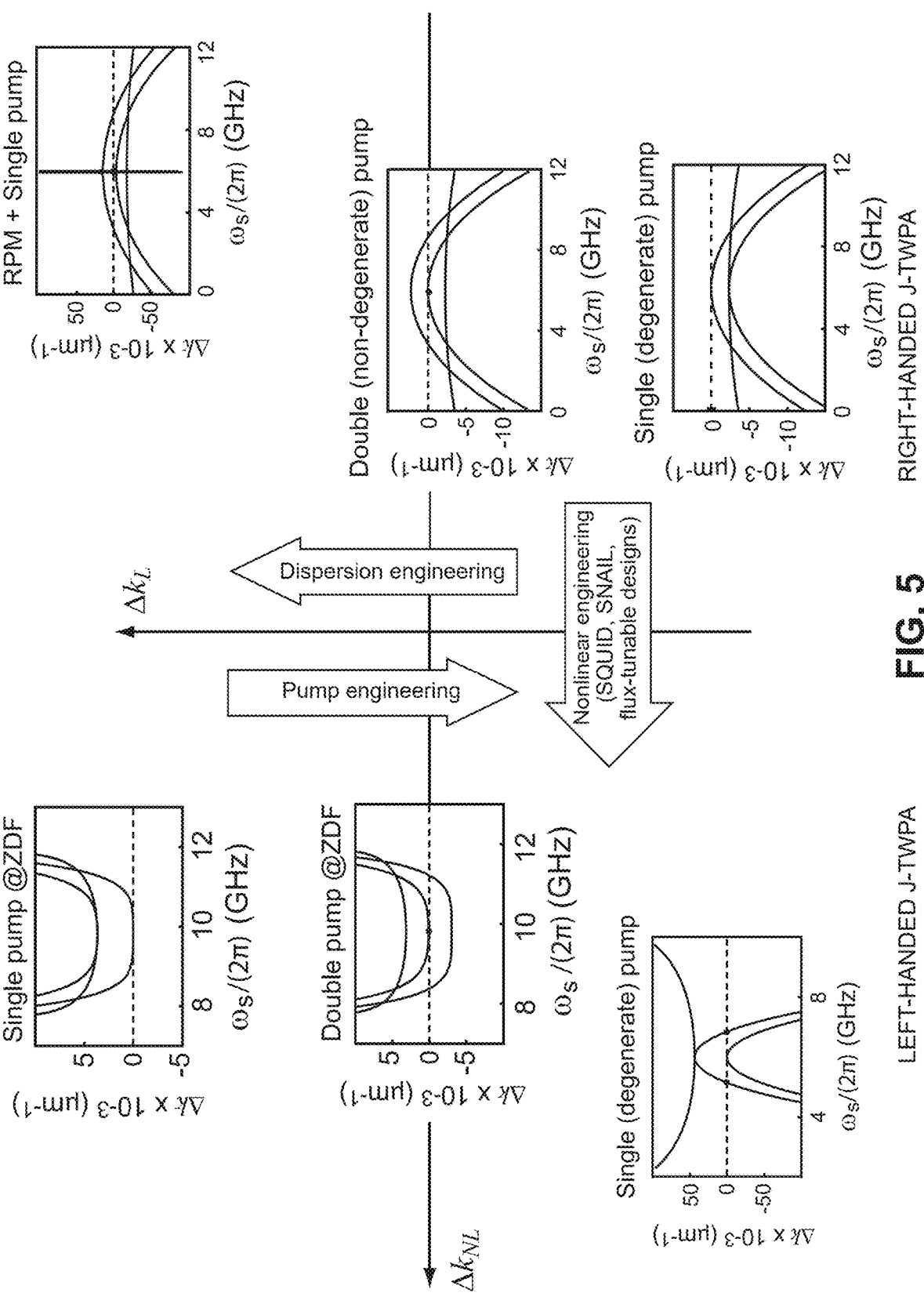
FIG. 5 is an example diagram of classification of different transmission line designs as discussed herein.

FIG. 5. Classification of J-TWPA designs in ($\Delta k_{NL}$, $\Delta k1$) plane. Different J-TWPA designs are indicated with the representative phase mismatch plots, showing linear (blue), nonlinear (red) and total (purple) wave vector mismatch. The gray quadrants represent the regions where sgn($\Delta k_L$)= sgn ($\Delta k_{NL}$) making it impossible to achieve perfect phase matching ($\Delta k$=0). The labeled blue and red arrows show the movement in this plane based on the nature of engineering solution.

S1. Equations of Motion for Left-Handed J-TWPA

S1. A. Wave Equation

In this section, we present the derivation of nonlinear equation of motion describing field propagation in a left-handed JTL using the method of nodes. Using the Kirchoff's current conservation law at the $n^{th}$ node for the circuit shown in FIG. 6, $$I_{n-1} = I_n + I_g = I_n + I_L + I_C. \qquad (9\text{-}S1)$$

where $$I_n = C\frac{d^2}{dt^2}(\phi_n - \phi_{n+1}), \qquad (10\text{-}S2a)$$

-continued $$I_C = C_J \frac{d^2\phi_n}{dt^2}, \tag{11-S2b}$$

$$I_L = I_0 \sin\left(\frac{\phi_n}{\phi_0}\right), \tag{12-S2c}$$

with $\phi_n$ denoting the node flux associated with the n-th node, $I_0$ the critical current of the Josephson junction, and $\phi_0 = \Phi_0/2\pi$ being the reduced flux quantum (with $\Phi_0 = h/2e$). Differentiating Eq. (12-S2C) and expanding the result for weak currents ($I_L \ll I_0$), leads to $$\frac{d\phi_n}{dt} = \frac{\phi_0}{I_0}\left(1 + \frac{1}{2}\left(\frac{I_L}{I_0}\right)^2\right)\frac{dI_L}{dt}. \tag{13-S3}$$

Equation (13-S3) can be solved for $\phi_n$ as $$\phi_n = L_f I_L + \frac{L_f}{6I_0^2}I_L^3. \tag{14-S4}$$

Figure 6:
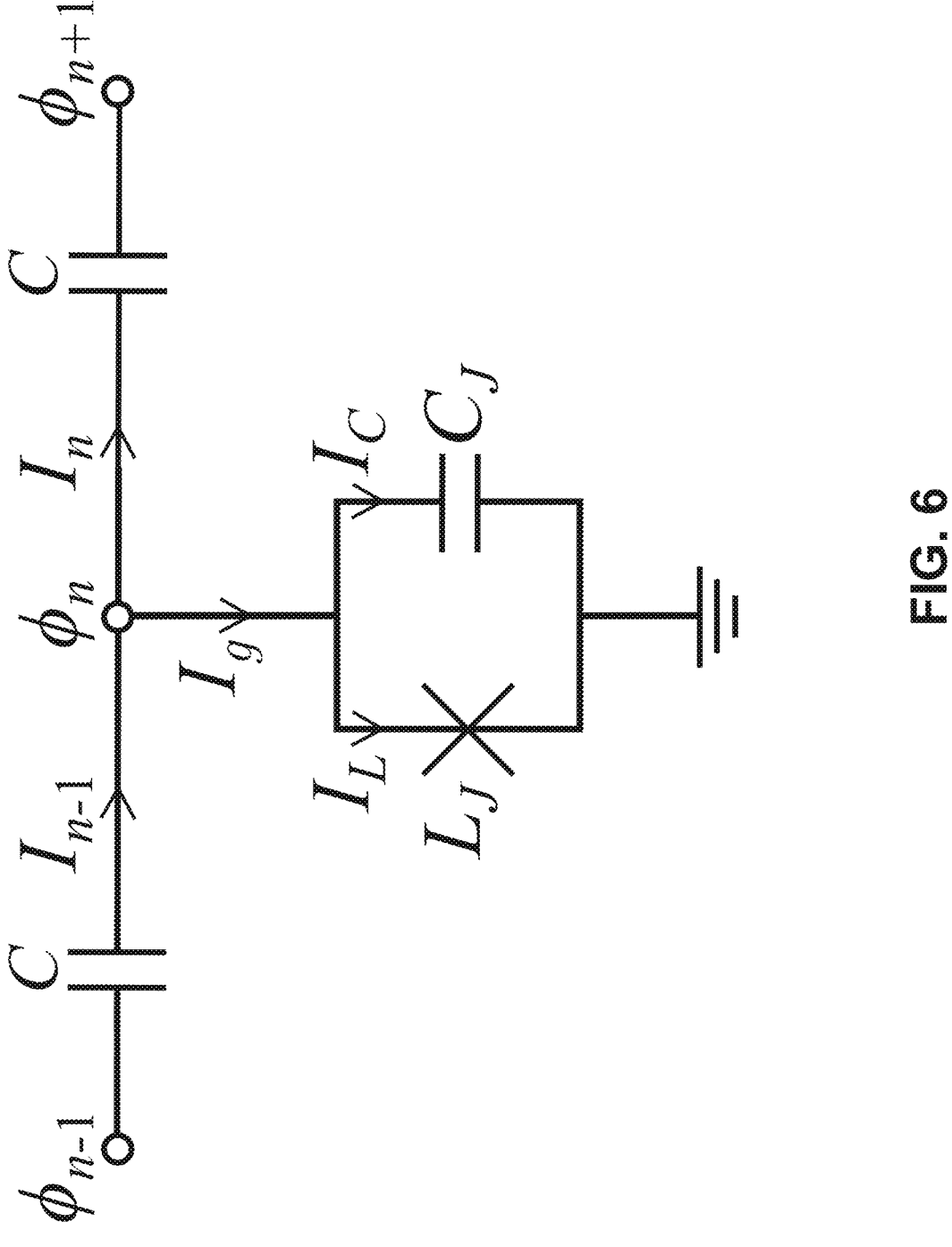
FIG. 6 is an example single unit cell of a left-handed Josephson transmission line as discussed herein.

FIG. 6-S1. Circuit diagram of a single unit cell of a left-handed Josephson transmission line (JTL).
where we have used $\phi_0 = L_J I_0$. Rearranging Eq. (14-S4) we can express $I_L$ in terms of $\phi_n$, $$I_L = \frac{\phi_n}{L_J} - \frac{\phi_n^2}{6I_0^2 L_J^3}. \tag{15-S5}$$

where in the nonlinear term leading order expression for $\phi_n \approx L_J I_L$ has been substituted. Putting everything together, Eq. (9-S1) gives $$C_J\frac{d^2\phi_n}{dt^2} - C\frac{d^2\phi}{dt^2}(\phi_{n+1} + \phi_{n-1} - 2\phi_n) + \frac{\phi_n}{L_J} - \frac{\phi_n^3}{6I_0^2 L_J^3} = 0. \tag{16-S6}$$

By taking the continuum limit of the equation above, we obtain Eq. (3) reported in the main text, $$C_J\frac{\partial^2 \phi}{\partial t^2} - Ca^2\frac{\partial^4 \phi}{\partial x^2 \partial t^2} + \frac{\phi}{L_J} = \frac{\phi^3}{6I_0^2 L_J^3}. \tag{17-S7}$$

S1.B. Coupled Amplitude Equations

The nonlinear wave equation can be simplified by introducing the plane wave ansatz for $\phi(x,t)$, and then performing harmonic balance at the frequencies of interest (here $\omega_p$, $\omega_s$ and $\omega_i$). To this end, we write $\phi(x,t)$ as $$\phi(x, t) = \tag{18-S8}$$
$$\frac{1}{2}\left(A_p(x)e^{i(k_p x + \omega_p t)} + A_s(x)e^{i(k_s x + \omega_s t)} + A_i(x)e^{i(k_i x + \omega_i t)} + c.c\right).$$

and establish equations of motion for envelope amplitudes $A_{p,s,i}(x)$. Substituting Eq. (17-S8) into Eq. (18-S7), making the slowly-varying envelope approximation, i.e. $(\partial^2 A_m/\partial x^2 \ll k_m \partial A_m/\partial x)$, and grouping the resonant terms at pump, signal and idler frequencies, Eq. (S7) reduces to $$A_p(x) = A_p(0)e^{i\alpha_p x}, \tag{19-S9a}$$

$$\frac{dA_s(x)}{dx} = i\alpha_s A_s(x) + i\beta_s A_i^*(x)e^{i(\Delta k_L + 2\alpha_p)x}, \tag{20-S9b}$$

$$\frac{dA_i(x)}{dx} = i\alpha_i A_i(x) + i\beta_i A_s^*(x)e^{i(\Delta k_L + 2\alpha_p)x}, \tag{21-S9b}$$

with $$\alpha_m = (2 - \delta_{p,m})\frac{\rho\omega_m}{v_g(\omega_m)}, \tag{22-S10a}$$

$$\beta_{z,i} = \frac{\rho\omega_{s,i}}{v_g(\omega_{s,i})}, \tag{23-S10b}$$

where $\rho$ denotes the nonlinear mixing coefficient determined entirely by pump frequency and amplitude, $$\rho = \left(\frac{I_p}{I_0}\right)^2\frac{Z_c^2}{16L^2\omega_p^2} = \left(\frac{I_p}{I_0}\right)^2\left(\frac{\omega_0}{4\omega_p}\right)^2. \tag{24-S11}$$

Here $m \in \{p,s,i\}$ and $Z_c$ denotes the characteristic impedance of the line which is chosen to be 50Ω to match the typical impedance of microwave circuitry at input and output. Note that we have ignored the dynamical backaction of signal-idler amplitudes on the pump (the so-called "stiff-pump" approximation, $|A_{s,i}(x)| \ll A_p(x)$) in writing the solution for the pump wave amplitude in Eq. (27 and 28-S13). Writing the signal and idler amplitudes as $A_s = a_s e^{i\alpha_s x}$ and $A_i = a_i e^{i\alpha_i x}$, Eqs. 22-23-S10 simplify to $$\frac{da_s}{dx} - i\beta_s a_i^* e^{i(\Delta k)x}, \tag{25-S12a}$$

$$\frac{da_i}{dx} - i\beta_i a_s^* e^{i(\Delta k)x}, \tag{26-S12b}$$

where $\Delta k = \Delta k_L + \Delta k_{NL}$, $$\Delta k_L = 2k_p - k_s - k_i, \tag{27-S13a}$$

$$\Delta k_{NL} = 2\alpha_p - \alpha_s - \alpha_i. \tag{28-S13b}$$

Figure S2 shows plots of $\alpha_{p,s,i}$ for the left-handed and right-handed J-TWPA respectively with the same circuit parameters as used in FIG. 2 of the main text. Note that for the right-handed case, $2\alpha_p < \alpha_s + \alpha_i$, hence $\Delta k_{NL} < 0$ as per Eq. (28-S13b). However, in the left-handed case, $2\alpha_p > \alpha_s + \alpha_i$ resulting in $\Delta k_{NL} > 0$.

Figure 7:
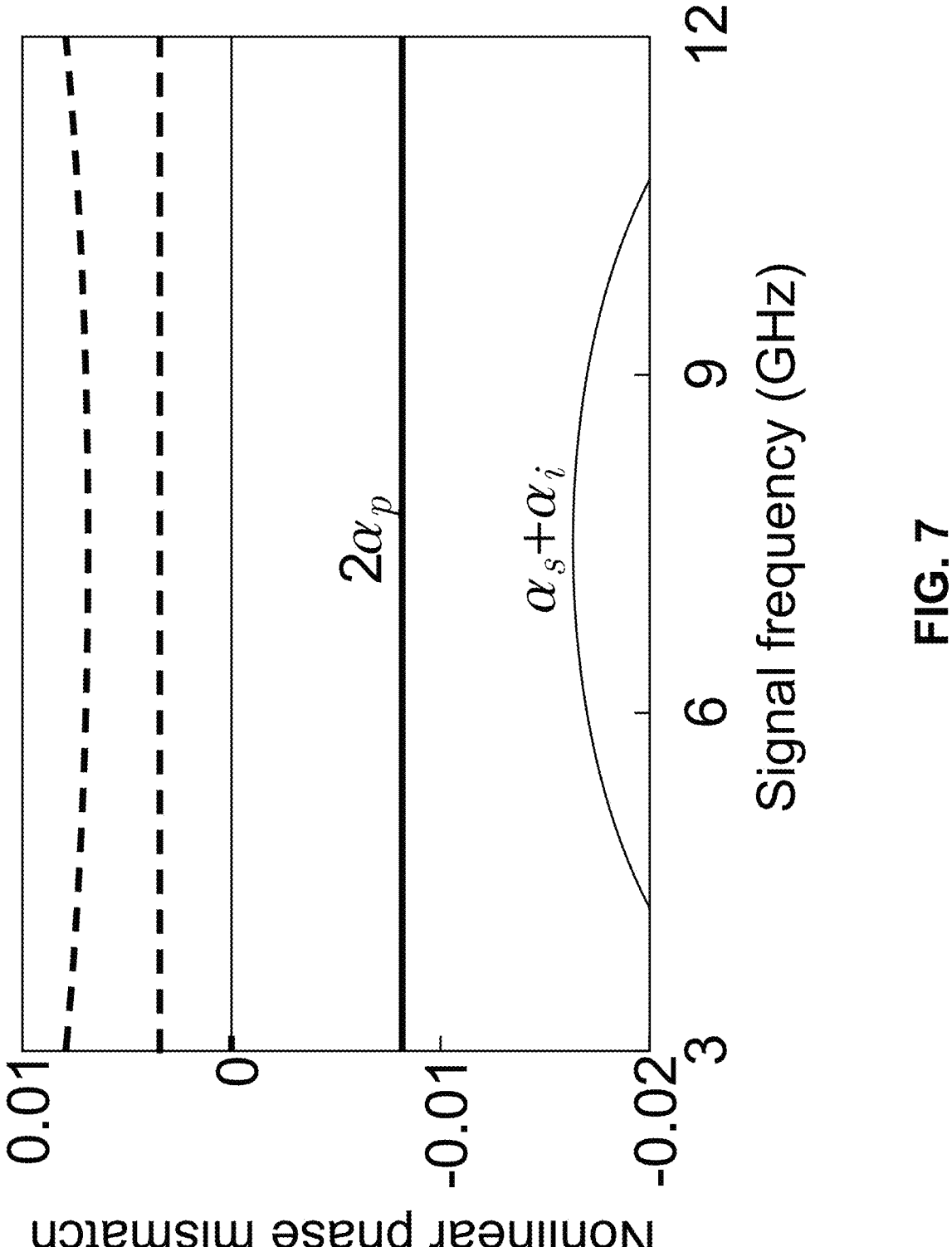
FIG. 7 is an example diagram illustrating comparison of nonmilitary phase mismatch between left-handed and write-handed transmission lines as discussed herein.

FIG. 7 is an example diagram illustrating comparison of nonlinear phase mismatch between left-handed (solid) and right-handed (dashed) J-TWPAs as discussed herein. The black curves show the self-phase modulation coefficient for the pump waves $2\alpha_p$, while the orange curves show the total crossphase modulation for signal and idler waves $\alpha_s + \alpha_i$. For the left-handed J-TWPA, $2\alpha_p > \alpha_s + \alpha_i$ giving $\Delta k_{NL} > 0$, while the opposite holds for right-handed J-TWPA.

S2. Signal-to-Pump Backaction and Non-Degenerate Pumping
S2.A. Dual Pump

Including the signal backaction on the pump necessitates solving the system of equations that includes the spatial variation of pump amplitudes $A_p(x)$ due to signal/idler backaction. For the most general case describing four-wave mixing, these equations are $$\frac{dA_1(x)}{dx} = i\beta_1 A_2^*(x)A_3(x)A_4(x)e^{-i\Delta k_L x} + iA_1 \sum_{m=1}^{4} \alpha_{1m}A_m(x)A_m^*(x), \qquad (29\text{–}S14a)$$

$$\frac{dA_2(x)}{dx} = i\beta_2 A_1^*(x)A_3(x)A_4(x)e^{-i\Delta k_L x} + iA_2 \sum_{m=1}^{4} \alpha_{2m}A_m(x)A_m^*(x), \qquad (30\text{–}S14b)$$

$$\frac{dA_3(x)}{dx} = i\beta_3 A_1(x)A_2(x)A_4^*(x)e^{i\Delta k_L x} + iA_3 \sum_{m=1}^{4} \alpha_{3m}A_m(x)A_m^*(x), \qquad (31\text{–}S14c)$$

$$\frac{dA_4(x)}{dx} = i\beta_4 A_1(x)A_2(x)A_3^*(x)e^{i\Delta k_L x} + iA_4 \sum_{m=1}^{4} \alpha_{4m}A_m(x)A_m^*(x). \qquad (32\text{–}S14d)$$

with the linear phase mismatch modified to $$\Delta k_L = k_1 + k_2 - k_3 - k_4. \qquad (33\text{–}S15)$$

The subscripts $\{1,2\}$ now index the two pump waves, while $\{3,4\}$ index the idler and signal waves respectively. The self- and cross-phase modulation coefficients are given by $$a_{mn} = \frac{\omega_m}{16 I_0^2 L^2 v_g(\omega_m)}(2 - \delta_{mn}), \qquad (34\text{–}S16a)$$

$$\beta_m = \frac{\omega_m}{8 I_0^2 L^2 v_g(\omega_m)}, \qquad (35\text{–}S16b)$$

where m, n=$\{1,2,3,4\}$.

Similar to the degenerate pump limit, we can first consider developing the solution for the nondegenerate case under the "stiff-pump" approximation, i.e. $|A_{1,2}(x)| \gg |A_{3,4}(x)|$. Under this assumption, we discard the terms which depend on the signal and idler amplitudes while evaluating the spatial propagation of the two pump waves. This simplifies Eqs. (34-35-S16)-(36-37-S17) as $$\frac{dA_2(x)}{dx} = i\alpha_{11}A_1(x)|A_1(x)|^2 + i\alpha_{12}A_2(x)|A_2(x)|^2, \qquad (36\text{–}S17a)$$

$$\frac{dA_2(x)}{dx} = i\alpha_{21}A_2(x)|A_1(x)|^2 + i\alpha_{22}A_2(x)|A_2(x)|^2, \qquad (37\text{–}S17b)$$

with the respective solutions given by $$A_1(x) = A_1(0)e^{i\tilde{\alpha}_{p1}x}, \; A_2(x) = A_2(0)e^{i\tilde{\alpha}_{p2}x} \qquad (38\text{–}S18)$$

where $$\tilde{\alpha}_{p1} \equiv \frac{2}{3}\sum_{k=1,2} \alpha_{1k}|A_k(0)|^2 = \frac{2}{3}\frac{\omega_1}{v_D(\omega_1)}(\rho_1 + 2\rho_2), \qquad (39\text{–}S19a)$$

$$\tilde{\alpha}_{p2} \equiv \frac{2}{3}\sum_{k=1,2} \alpha_{2k}|A_k(0)|^2 = \frac{2}{3}\frac{\omega_2}{v_g(\omega_2)}(\rho_2 + 2\rho_1). \qquad (40\text{–}S19b)$$

Here, $\rho_{1,2}$ denote the nonlinear mixing coefficients corresponding to each of the two pumps, $$\rho_{1,2} = \frac{1}{2}\left(\frac{I_{1,2}}{I_0}\right)^2\left(\frac{\omega_0}{4\omega_{1,2}}\right)^2, \qquad (41\text{–}S20)$$

where we have used $A_j(0) = I_j Z_c/(\sqrt{2}\omega_j)$, $j\in\{1,2\}$ as the respective pump amplitudes at the input. Note that we have introduced a correction factor of $2/3$ while defining $\tilde{\alpha}_{p1}$, $\tilde{\alpha}_{p2}$. This is required to ensure quantitative agreement with the analysis for the single-pump case presented in Appendix S1.2; specifically, in the limiting case of single-pump, $\omega_1 = \omega_2 = \omega_p$ and $A_1(x) = A_2(x) = A_p(x)$, the definition in Eqs. (39-40-S19) enforces $$\tilde{\alpha}_{p1} + \tilde{\alpha}_{p2} = 2\alpha_p, \qquad (42\text{–}S21)$$

with $\alpha_p$ being the pump modulation coefficient reported in Eq. S10a for the single-pump case.

Similarly, under the "stiff-pump" approximation for double pumps, the signal and idler equations simplify to $$\frac{dA_3(x)}{dx} = i\tilde{\alpha}_3 A_3 + i\tilde{\beta}_s A_4^*(x)e^{i(\Delta k_L + \tilde{\alpha}_{p1} + \tilde{\alpha}_{p2})x}, \qquad (43\text{–}S22a)$$

$$\frac{dA_4(x)}{dx} = i\tilde{\alpha}_i A_4 + i\tilde{\beta}_i A_3^*(x)e^{i(\Delta k_L + \tilde{\alpha}_{p1} + \tilde{\alpha}_{p2})x}, \qquad (44\text{–}S22b)$$

with the pump-induced self-phase modulation of the signal/idler waves described by the coefficients, $$\tilde{\alpha}_s = \sum_{k=1,2} \alpha_{3k}|A_k(0)|^2 = (\rho_1 + \rho_2)\frac{2\omega_3}{v_g(\omega_3)}, \qquad (45\text{–}S23a)$$

$$\tilde{\alpha}_i = \sum_{k=1,2} \alpha_{4k}|A_k(0)|^2 = (\rho_1 + \rho_2)\frac{2\omega_4}{v_g(\omega_4)}, \qquad (46\text{–}S23b)$$

and the cross-phase modulation of the signal/idler waves described by the coefficients, $$\tilde{\beta}_s = \sqrt{\rho_1\rho_2}\frac{2\omega_3}{v_g(\omega_3)}, \; \tilde{\beta}_i = \sqrt{\rho_1\rho_2}\frac{2\omega_4}{v_g(\omega_4)}. \qquad (47\text{–}S24)$$

As in the single-pump analysis, we have ignored the self and cross-phase modulation induced by signal and idler waves under the small signal approximation. Following same steps as sketched in Appendix S1, cis-gain $G_c(x)$ can be calculated with an effective $\tilde{g}$, $$\tilde{g} = \sqrt{\tilde{\beta}_s \tilde{\beta}_i^* - \left(\frac{\Delta k}{2}\right)^2}, \qquad (48\text{–}S25)$$

where, $\Delta k = \Delta k_L + \Delta k_{NL}$ as before, but with the nonlinear wave vector mismatch now defined as, $$\Delta k_{NL} = \tilde{\alpha}_{p1} + \tilde{\alpha}_{p2} - \tilde{\alpha}_3 - \tilde{\alpha}_i. \qquad (49\text{–}S26)$$

The calculation of $G_c(x)$ reported for the nondegenerate pumping near $\omega_{ZD}$ in FIG. 44 of the main text makes use of the reduced system of equations in Eq. (43-44-S22). For the dynamic range calculation presented in FIG. 3 of the main text, we used the full system of equations in Eqs. (S14), along with the modifications to the pump modulation coefficients as defined in Eq. (S19).

S2. B. Dynamic Range Comparison of Left- and Right-Handed J-TWPAs

Figure 8:
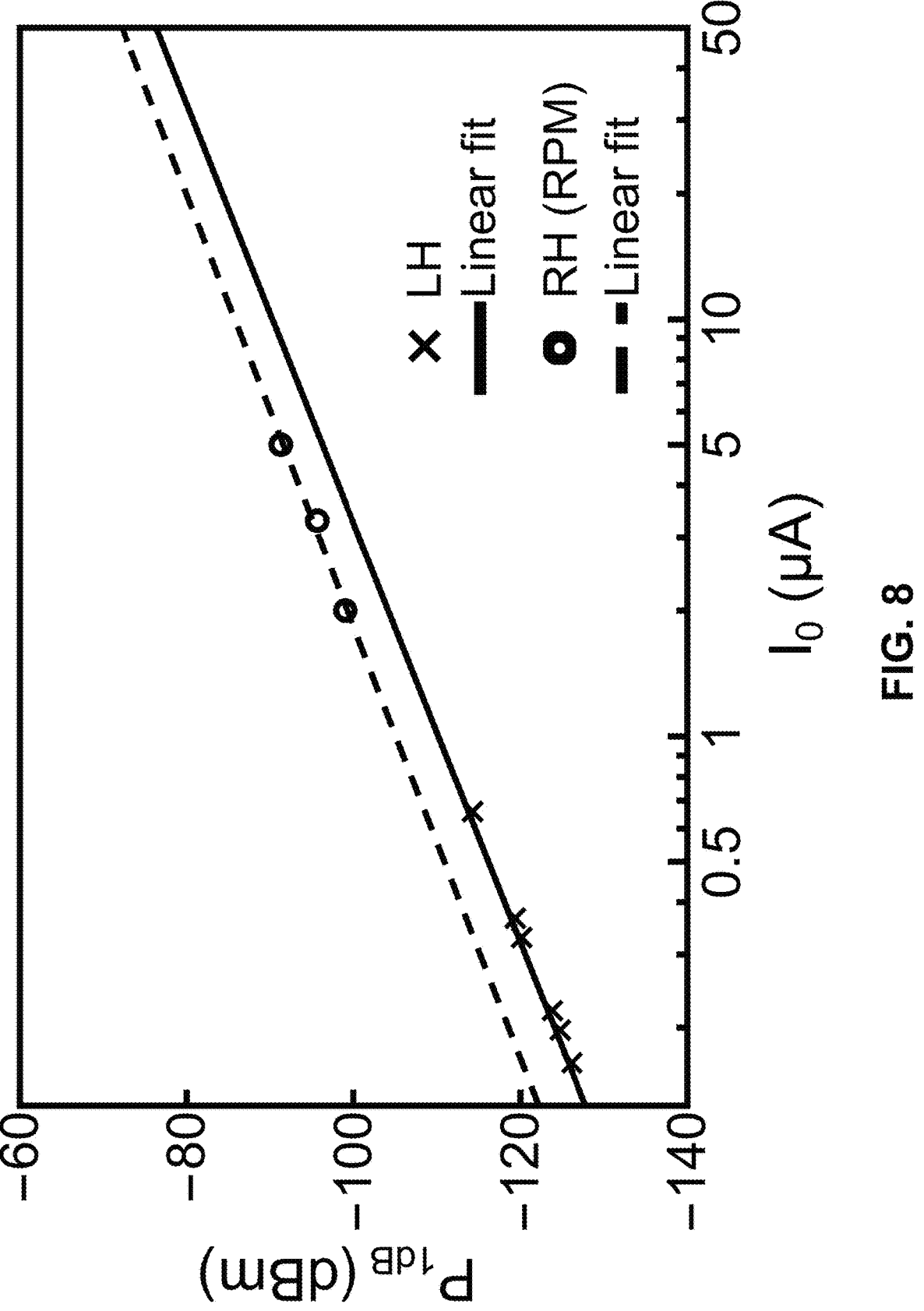
FIG. 8 is an example diagram illustrating comparison of one decibel of compression-power for a left-handed transmission line versus a right-handed transmission line as discussed herein.

FIG. 8 is an example diagram illustrating comparison of the dynamic range for left-handed (crosses) and right-handed (open circles) J-TWPAs as a function of the critical current $I_0$ for a peak gain of 20 dB discussed herein. The input power corresponding to 1 dB gain compression is approximately 5 dB lower in the left-handed device due to the larger junction inductance. In general, increasing $I_0$ improves the saturation power for both J-TWPA designs, with an increase of around 1.4 dB in $P_1$ dB per dB decrease in gain.

A relatively standard way of improving the power handling capability, is to use an array of N junctions, with each junction having a critical current value of $NI_0$[1, instead of a single small junction to get the requisite inductance.

FIG. 8 is an example diagram illustrating comparison of 1 dB compression power $P_1$ dB in the left-handed and right-handed J-TWPAs as a function of critical current $I_0$. To ensure the validity of the continuum approximation, the calculations for the left-handed J-TWPA are performed for smaller values of critical current, leading to an overall smaller 1 dB compression power.

S3. Zero Dispersion Frequency (ZDF)

Expanding $k(\omega)$ around the pump frequency $\omega_p$, $$k(\omega) = k(\omega_p) + \sum_{m=1}^{\infty} \frac{D_m(\omega)}{m!}\bigg|_{\omega_p} (\omega - \omega_p)^m, \text{ with} \qquad (50\text{–}S27)$$

$$D_m(\omega) = \frac{d^m k(\omega)}{d\omega^m}, \qquad (51\text{–}S28)$$

we can write the wave vector at a fixed detuning $\delta$ from the pump, $\omega = \omega_p (1+\delta)$, as $$k(\delta) = k(0) + \sum_{m=1}^{\infty} \frac{D_m(\delta)}{m!}\bigg|_{\delta=0} \delta^m. \qquad (52\text{–}S29)$$

Using $k_s = k(-\delta)$ and $k_i = k(\delta)$, $$\Delta k_L(\delta) = 2k(0) - k(-\delta) - k(\delta) \qquad (53\text{–}S30)$$
$$= -2\sum_{m=1}^{\infty} D_{2m}(\delta)\bigg|_{\delta=0} \frac{\delta^{2m}}{(2m)!},$$

where only the even-order dispersion parameters survive 2. The sign of leading order term $D_2(\omega)$, also known as the group velocity dispersion (GVD) parameter, determines the sign of $\Delta k_L(\delta)$ at a given detuning.

Figure 9A:
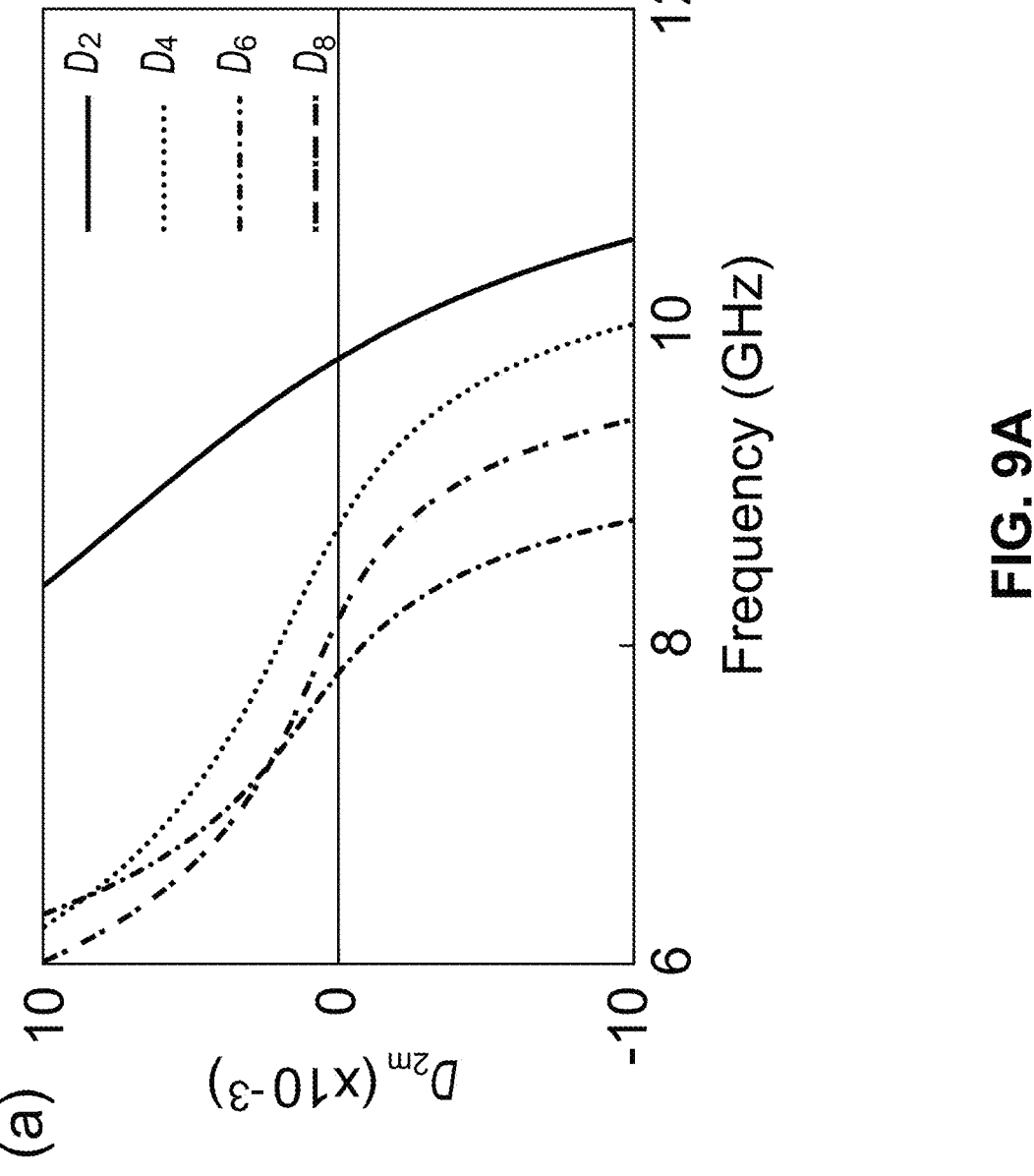
FIG. 9A is an example diagram illustrating even order dispersion associated with a left-handed transmission line as discussed herein.

FIG. 9A is an example diagram illustrating frequency dependence of higher even-order dispersion parameters calculated for a lefthanded JTL. For frequencies $\omega > \omega_{ZD}$, $D_{2,4,6,8}(\omega) < 0$ leading to $sgn(\Delta k_L) > 0$, in accordance with Eq. (53-S30). FIG. 4B is an example diagram comparing the GVD parameter $D_2(\omega)$ calculated for both the left- and right-handed JTLs. The $\omega_{ZD}$ corresponds to the x-intercept of the the GVD parameter, i.e. $D_2(\omega_{ZD})=0$. For a right-handed JTL, $D_2(\omega) > 0$, $\forall \omega < \omega_J$ preempting the existence of an $\omega_{ZD}$.

Figure 9B:
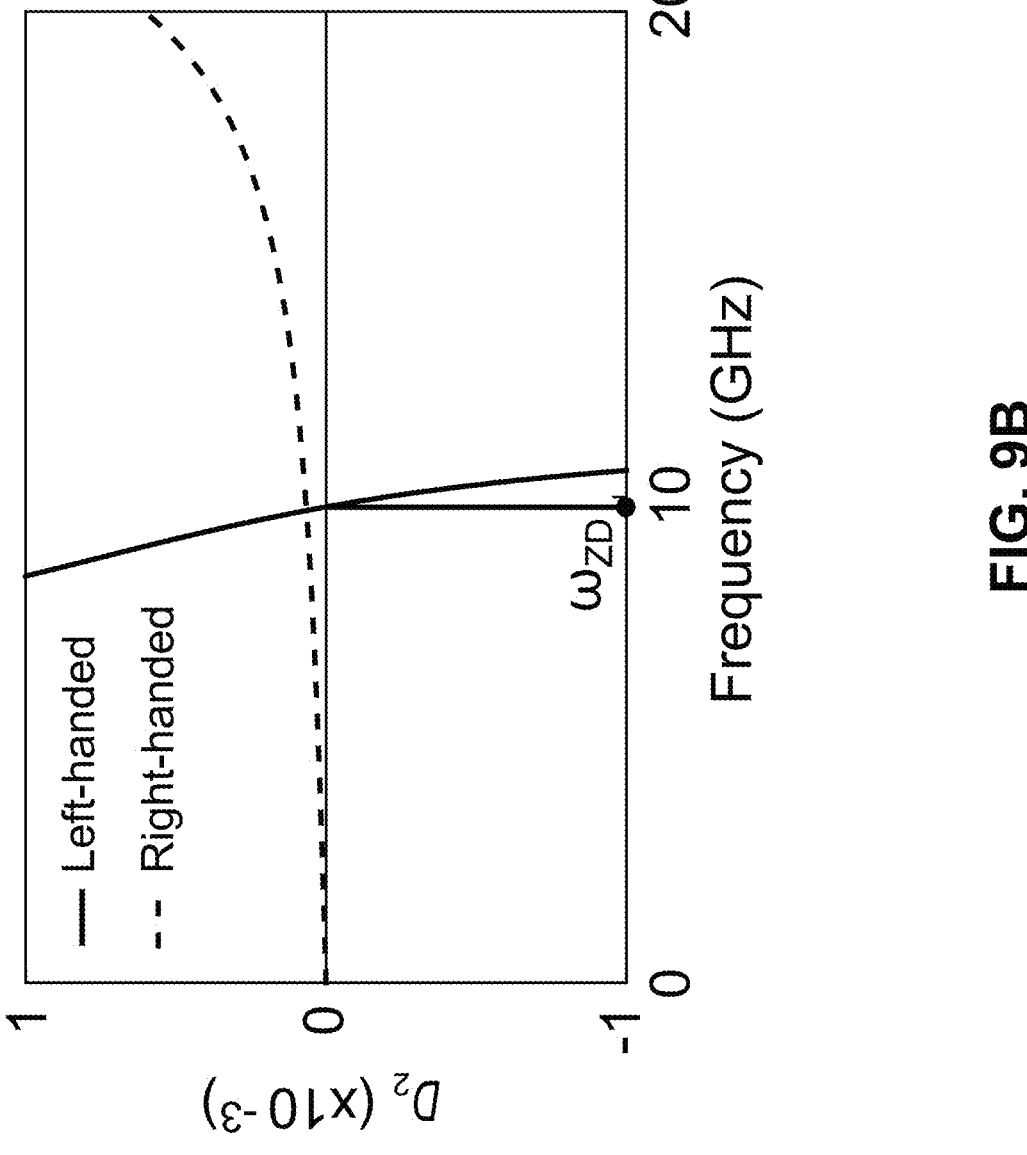
FIG. 9B is an example diagram illustrating comparison of D2 for a left-handed transmission line versus a right-handed transmission line as discussed herein.

FIG. 9A is an example diagram illustrating even-order dispersion parameters $D_{2m}$ as a function of frequency for the left-handed J-TWPA. The circuit parameters used are the same as those used in FIG. 4 of the main text. FIG. 9 B is an example diagram illustrating comparison of $D_2(\omega)$ for left-handed (solid) and right-handed (dashed) JTLs. The circuit parameters for the right-handed J-TWPA are the same as those used in FIG. 2 of the main text. The position of $\omega_{ZD} \approx 9.8$ GHz is indicated with the orange dot on x-axis.

S4. Non-Idealities in a Left-Handed JTL

S4.A. Effect of Higher Harmonics

To estimate the magnitude of third harmonic generation, we employ the following modified wave ansatz $\phi(x,t)$ in Eq. S7, $$\phi(x, t) = \frac{1}{2}\left(A_p(x)e^{i(k_p x + \omega_p t)} + A_{th}(x)e^{i(k_{th} x + \omega_{th} t)} + c.c\right), \qquad (54\text{–}S31a)$$

with $\omega_{TH} = 3\omega_p$. Going to a rotating frame defined as $A_{th}(x) = a_{th}e^{i\kappa_1 x}$, the equations of motion for the amplitudes of the fundamental pump tone $A_p(x)$ and the third pump harmonic $a_{th}(x)$ can be written as, $$\frac{dA_p}{dx} = i\kappa_0 A_p, \qquad (55\text{–}S32a)$$

$$\frac{d\alpha_{th}}{dx} = -i\kappa_2 e^{i(\Delta k_L + 3\kappa_0 - \kappa_1)x}. \qquad (56\text{–}S32b)$$

The solutions to the above equations can be simply written as, $$A_p(x) = A_p(0)e^{i\kappa_0 x}, \qquad (57\text{–}S33a)$$

$$\alpha_{th}(x) = \frac{(1 - e^{i\Delta kx})\kappa_2}{\Delta k}, \qquad (58\text{–}S33b)$$

$$\text{where, } \kappa_0 = -\frac{\rho k_p}{1 - \omega_p^2/\omega_J^2}, \qquad (59\text{–}S34a)$$

$$\kappa_1 = -\frac{2\rho k_{th}}{1 - \omega_{th}^2/\omega_J^2}, \qquad (60\text{–}S34b)$$

$$\kappa_2 = -\frac{\rho k_{th}}{3(1 - \omega_{th}^2/\omega_J^2)}A_p(0), \qquad (61\text{–}S34c)$$

with $A_p(0) = I_p Z_c/\omega_p$, $\Delta k = \Delta k_L + 3\kappa_0 - \kappa_1$ and $\Delta k_L = 3k_p - k_{TH}$. Note that in writing the solutions in Eq. (50-S33b), we have ignored the effect of backaction from the third harmonic on the fundamental pump tone. Relaxing this 'stiff pump' condition leads to enhancement of absolute magnitude of $a_{th}$, but as far as comparing the relative magnitudes of third harmonic generation between left- and right-handed designs is concerned, a reliable estimate can still be obtained under this simplifying approximation.

Figure 10:
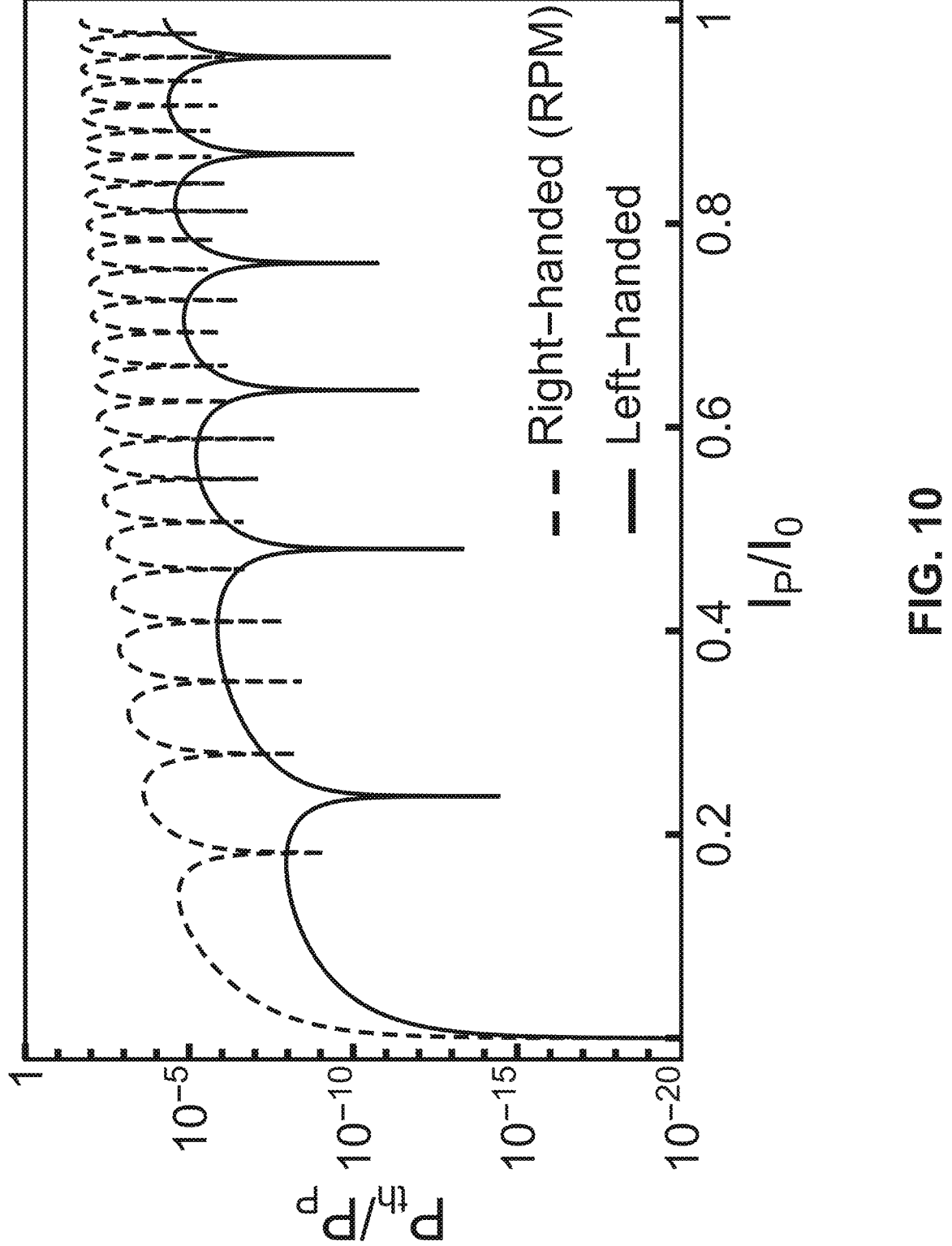
FIG. 10 is an example diagram illustrating comparison of normalized third harmonic power as discussed herein.

One can further define the third harmonic power as, $P_{th} = I_{th}^2 Z_c/2$ where the current $I_{th} = |A_{th}(x)|\omega_{th}/Z_c$. FIG. 10 is an example diagram comparing $P_{th}$ relative to the fundamental pump power $P_p$ for the left- and right-handed J-TWPAs as a function of normalized pump current $I_p/I_0$. The circuit parameters for the resonant element of the right-handed J-TWPA follows from Ref. [3]. At $I_p=0.510$, $P_{th}/P_p \approx 10^{-7}$ for the left-handed line whereas $P_{th}/P_p \approx 10^{-4}$ for the right-handed line. Hence the third harmonic power is three orders of magnitude smaller for the lefthanded compared to the right-handed JTL.

FIG. 10 is an example diagram illustrating comparison of normalized third harmonic power $P_{th}$ for left-handed (solid) and right-handed (dashed) RPM J-TWPAs. Aside from the resonant elements, the circuit parameters for both left- and right-J-TWPAs are the same as those used in FIG. 2 of the main text. For $I_p = 0.5 \ I_0$, the third harmonic power is approximately three orders of magnitude smaller in the left-handed J-TWPA than the righthanded J-TWPA.

S4.B. Effect of Distributed Loss in a Left-handed J-TWPA
The primary loss mechanism in J-TWPAs is due to the dielectric loss of capacitance associated with the line. This insertion loss can thus be modeled by adding a fictitious resistor R in parallel to the capacitor C in each unit cell. The modified wave equation from Eq. S7 in presence of these resistors can be written as, $$C_J \frac{\partial^2 \phi}{\partial t^2} - Ca^2 \frac{\partial^4 \phi}{\partial x^2 + \partial t^2} + \frac{\phi}{L_J} - \frac{a^2}{R} \frac{\partial^3 \phi}{\partial t \partial x^2} = \frac{\phi^3}{6 l_0^2 L_J^3}, \qquad (62\text{-}S35)$$

where the fourth term on the left-hand side of the equality describes the effect of dielectric loss. By introducing the loss per unit length experienced by the signal and idler modes as $\Gamma_{s,i}$, Eqs. S9 b-S9c lead to the following set of coupled equations for signal and idler wave amplitudes, $$\frac{dA_s(x)}{dx} = -\frac{\Gamma_s}{2} A_s(x) + i\alpha'_s A_s(x) + i\beta'_s A_i^*(x) e^{i(\Delta k_L + 2\alpha'_p)x}, \qquad (63\text{-}S36a)$$

$$\frac{dA_i(x)}{dx} = -\frac{\Gamma_i}{2} A_i(x) + i\alpha'_i A_i(x) + i\beta'_i A_i^*(x) e^{i(\Delta k_L + 2\alpha'_p)x}, \qquad (64\text{-}S36b)$$

$$\text{where, } \Gamma_{s,i} = \frac{k_{s,i}\tan\delta}{1 + \tan^2\delta}\left(1 - \frac{4\rho}{1 - \omega_{s,i}^2/\omega_J^2}\right), \qquad (65\text{-}S37a)$$

$$\alpha'_{s,i} = -\frac{k_{s,i}}{2(1 + \tan^2\delta)}\left(\tan^2\delta + \frac{4\rho}{1 - \frac{\omega_{s,i}^2}{\omega_J^2}}\right), \qquad (66\text{-}S37b)$$

$$\beta'_{s,i} = \frac{\rho k_{s,i}}{(1 - i\tan\delta)\left(1 - \frac{\omega_{s,i}^2}{\omega_J^2}\right)}. \qquad (67\text{-}S37c)$$

Without loss of generality, we parametrize the value of resistance corresponding to the loss seen at pump frequency, i.e. $\tan \delta = 1/\omega_p$ RC. Adopting a similar method as done for the lossless case, the expression for signal gain in the presence of loss is calculated as $$G'_c(x) = \qquad (16\text{-}S38)$$

$$\left|\left(\cosh(g'x) + \frac{\Gamma_i - \Gamma_s}{4g'}\sinh(g'x) - \frac{i\Delta k^i}{2g'}\sinh(g'x)\right)e^{-(\Gamma_s + \Gamma_i)x/4}\right|^2.$$

Here, g' denotes the modified gain per unit length in the presence of loss, $$g' = \sqrt{\left(\beta'_s\beta'^*_i + \left(\frac{\Gamma_i - \Gamma_s - 2i\Delta k'}{4}\right)^2\right)}, \qquad (69\text{-}S39)$$

with $\Delta k_{NL} = 2\alpha'_p - \alpha'_s - \alpha'_i$ and $\Delta k' = \Delta k_L + \Delta k'_{NL}$. We note that the form of the expression for signal gain in the presence of loss is identical to that obtained for a right-handed J-TWPA in presence of distributed loss [4, even though the details of frequency dependence of various parameters entering the expression are obviously different.

Figure 11:
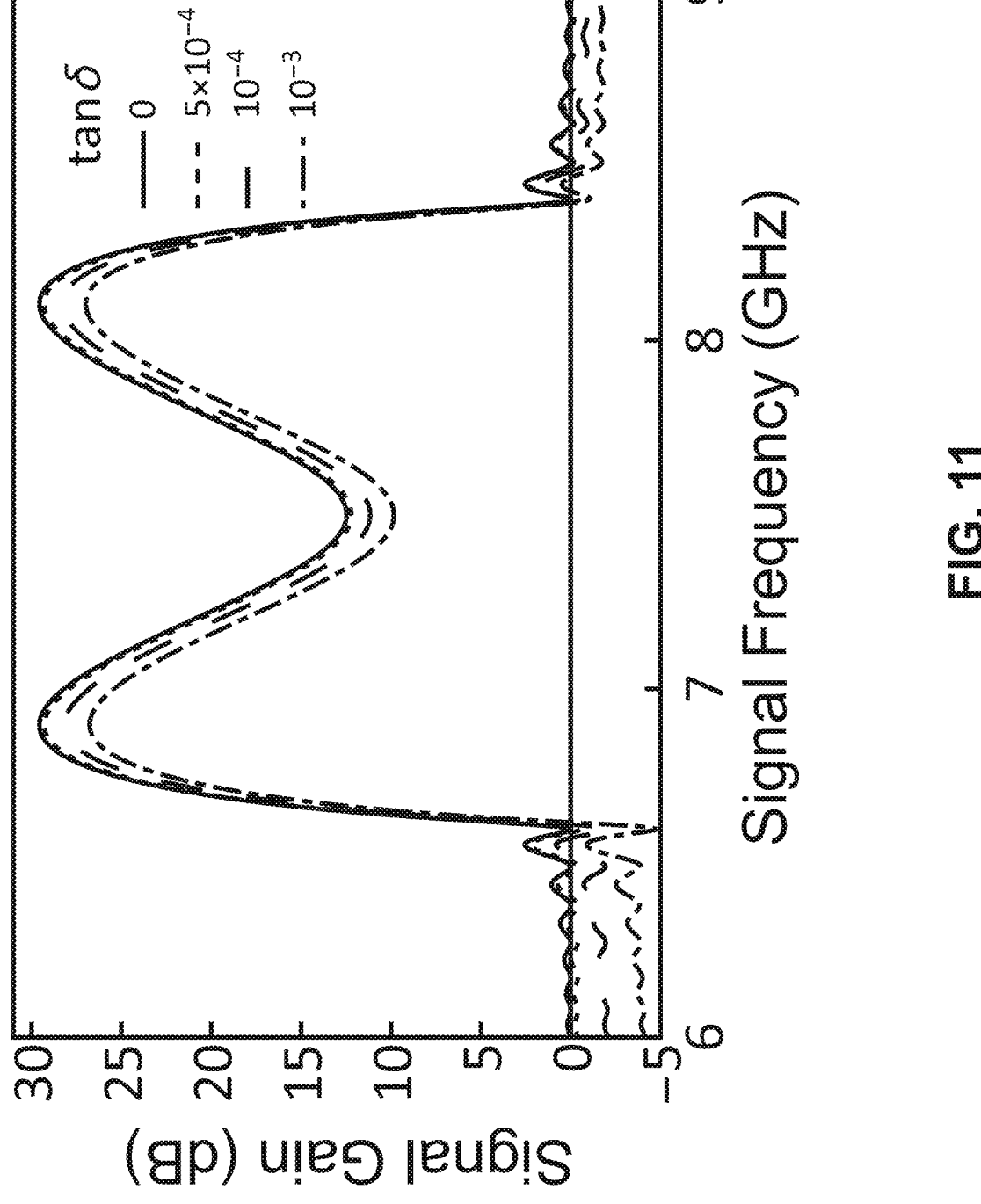
FIG. 11 is an example diagram illustrating frequency dependence of signal gain for different magnitudes of loss in a left-handed transmission line as discussed herein.

As shown in FIG. 11, for a typical (and not entirely optimistic!) value for dielectric loss tangent, tan $\delta = 10^{-3}$[5, the insertion loss for left-handed J-TWPA at $\delta_{max}$ is $\approx 3$ dB. In contrast, for a right-handed JTL of length$\approx 1000a$ and tan $\delta = 10^{-3}$, the insertion loss is $\approx 1.3$ dB [5], dominantly contributed by the dielectric of the capacitor forming the RPM element. Given the higher gain per unit length for left-handed JTL, for a fixed peak gain, some of this loss can be compensated by using a shorter left-handed J-TWPA with a net loss to the right-handed counterpart.

FIG. 11 is an example diagram illustrating frequency-dependence of signal gain for different magnitudes of loss in a left-handed JTWPA. The circuit parameters used are similar to those used in FIG. 2 of the main text. For tan $\delta = 10^{-3}$, the peak gain drops by around 3 dB.

Figure 12:
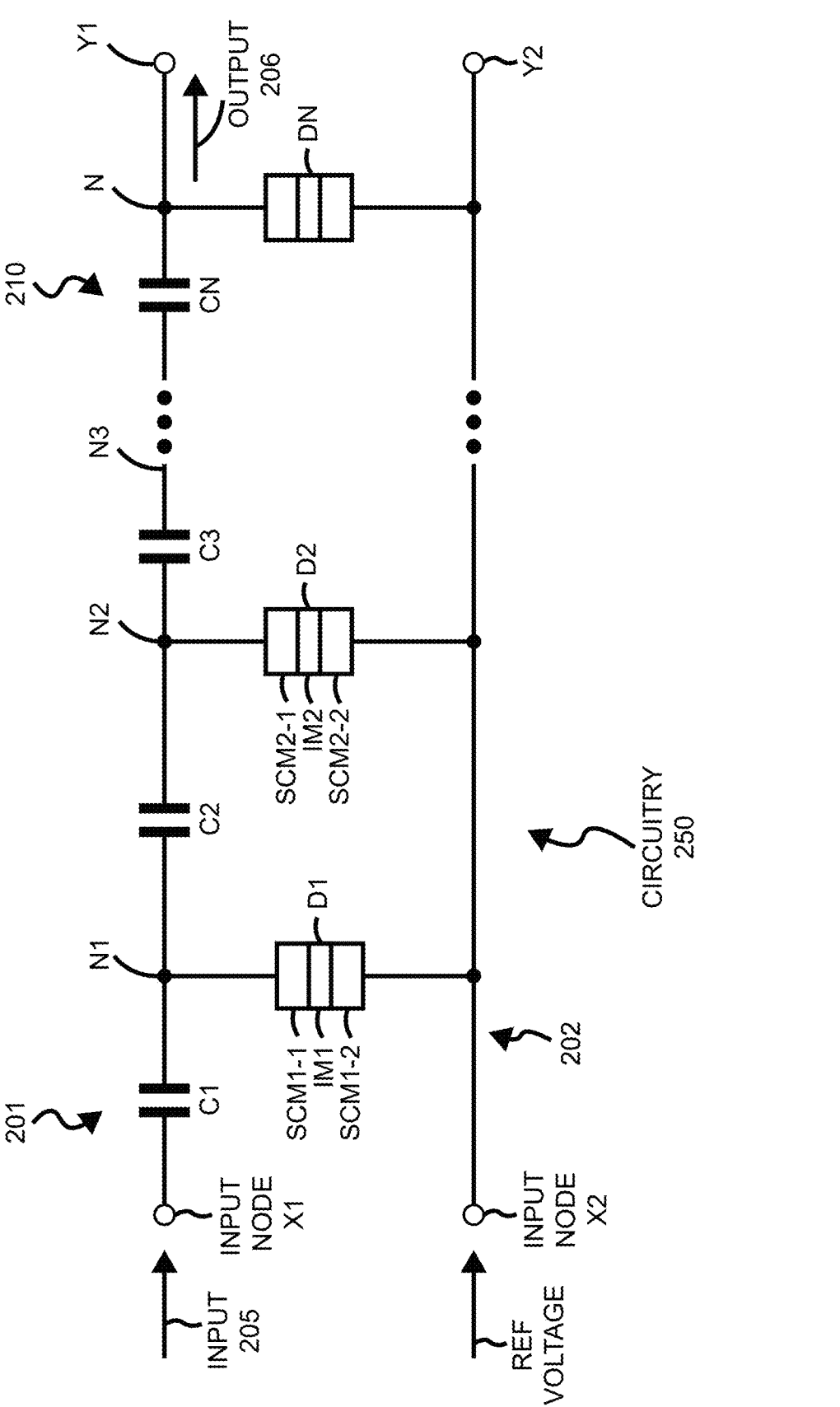
FIG. 12 is an example diagram illustrating a transmission line and corresponding amplifier circuitry as discussed herein.

FIG. 12 is an example diagram illustrating a transmission line including corresponding amplifier circuitry as discussed herein.

In this example, the transmission line 100 includes multiple capacitors such as capacitor C1, capacitor C2, capacitor C3, . . . , capacitor CN; multiple components such as component D1, component D2, . . . component DN; multiple input nodes such as a input node X1 and input node X2; and multiple output nodes such as output node Y1 and output node Y2.

The circuitry 250 (such as providing amplification to the input 205 to produce the corresponding output 206) of the transmission line 100 includes multiple capacitors such as capacitor C1, capacitor C2, capacitor C3, . . . , capacitor CN; multiple components such as component D1, component D2, . . . component DN.

In one example, each of the components including component D1, component D2, . . . component DN is a so-called shunt component or, more specifically, a Josephson junction component.

Thus, as further shown, each of the components D1, D2, . . . , DN can be so-called Josephson junction components. For example, the shunt component D1 can be configured to include insulator material IM1 disposed between the superconductor material SCM1-1 and the superconductor material SCM1-2; the shunt component D2 can be configured to include insulator material IM2 (such as a material as IM1) disposed between the superconductor material SCM2-1 and the superconductor material SCM2-2; . . . ; the shunt component DN can be configured to include insulator material IMN (such as same material as IM1) disposed between the superconductor material SCM2-N and the superconductor material SCM2-N.

Thus, if desired, each of the different complements D1, D2, . . . . DN, may be fabricated in a similar or identical manner.

The transmission line 210 is operated at sufficiently cold temperatures to support superconductivity associated with the Josephson junction components.

As further shown, the circuit path 201 extending between the input node X1 and the output node Y1 includes multiple capacitors C1, C2, C3, . . . , CN disposed in series. For example, a first terminal of the capacitor C1 is directly coupled to the input node X1; a second terminal of the capacitor C1 is directly coupled to the node N1. A first terminal of the capacitor C2 is directly coupled to the node N1; a second terminal of the capacitor C2 is directly coupled to the node N2, and so on.

Further in this example, the first terminal of the component D1 (such as a Josephson junction component) is directly connected to the circuit path 201 at node N1; the second terminal of the component D1 is directly connected to the circuit path 202 (such as reference voltage node).

The first terminal of the component D2 (such as a Josephson junction component) is directly connected to the circuit path 201 at node N2; the second terminal of the component D2 is directly connected to the circuit path 202.

The first terminal of the component DN (such as a Josephson junction component) is directly connected to the circuit path 201 at output node Y1; the second terminal of the component D2 is directly connected to the circuit path 202.

Via the circuit path 202, the input node X2 is directly connected to the output node Y2.

In one example, the input node X1 receives the input 205. The input node X2 is connected to a respective reference voltage (or signal) such as ground or other suitable reference voltage. The output node Y1 is operative to output the output signal 206. The output node Y2 can be connected to a respective reference voltage if desired. Each of the capacitors disposed in the circuit path 201 provide capacitive coupling between a first portion of the first circuit path 201 and a second portion of the first circuit path 201. For example, the capacitor C1 provides capacitive coupling between the input node X1 and the node N1 in the circuit path 201; the capacitor C2 provides capacitive coupling between the node N1 and the node N2 in the circuit path 201; and so on.

In other words, the capacitor C1 passes the AC voltage from the input node X1 to the node N1 while blocking any DC voltage associated with the input node X1 to the node N1; the capacitor C2 passes the AC voltage from the node N1 to the node N2 while blocking any DC voltage associated with the node N1 to the node N2; and so on.

As previously discussed, the transmission line 210 can be fabricated in the respective substrate 199.

Thus, the circuitry 250 associated with the transmission line 210 can be configured to include multiple capacitor components disposed in series in the circuit path 201 extending between the input node X1 and the output node Y1; the multiple capacitor components associated with the circuitry 250 may include at least the first capacitor component C1 and a second capacitor component C2 as well as multiple components such as component D1 (such as a first Josephson junction component), component D2 (such as a second Josephson junction component), and so on.

Figure 13:
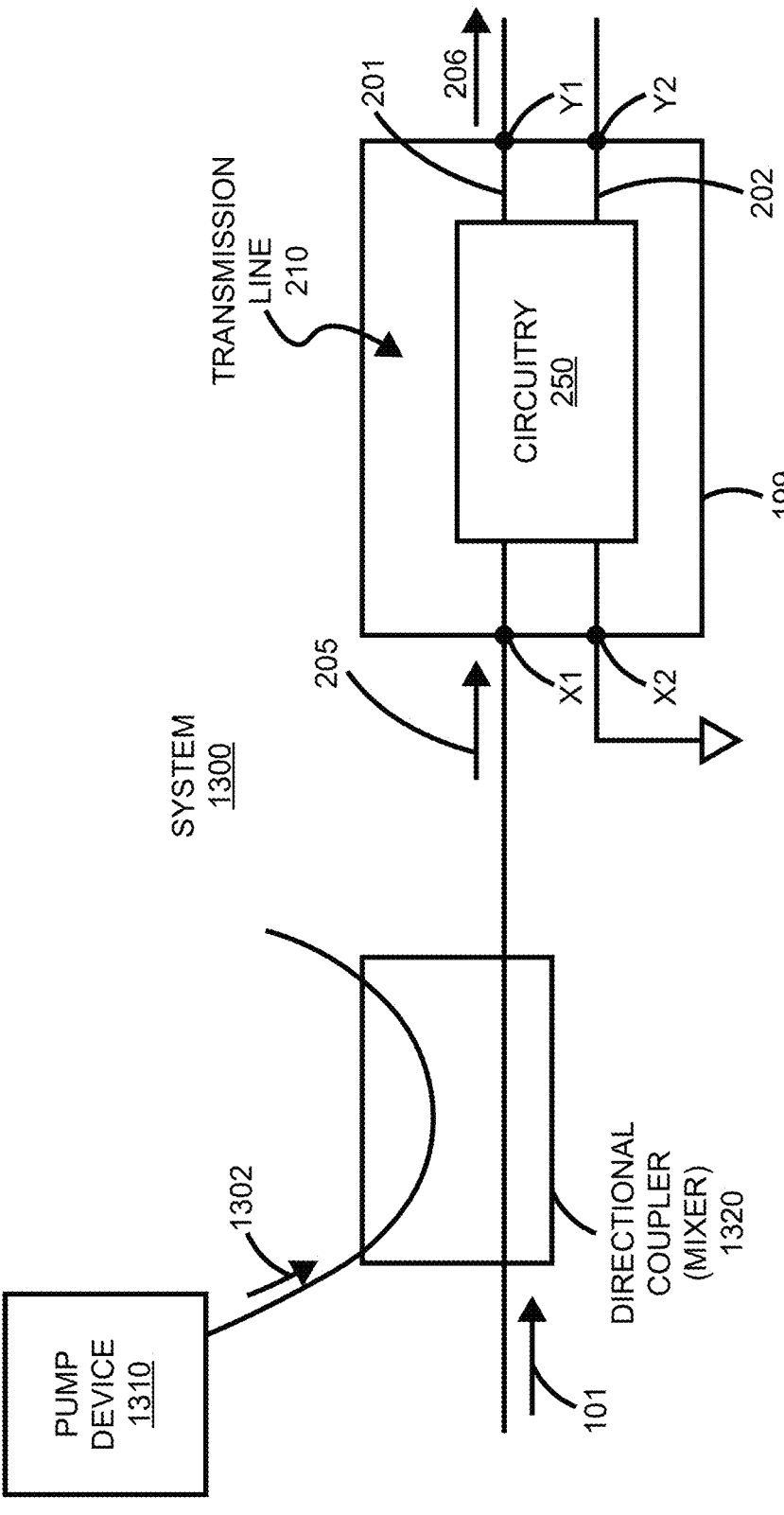
FIG. 13 is an example system diagram illustrating operation of a respective transmission line via implementation of a single pump as discussed herein.

FIG. 13 is an example system diagram illustrating operation of a respective transmission line via implementation of a single pump as discussed herein.

As shown in FIG. 13, the system 1300 includes pump device 1310, directional coupler 1320 (such as a mixer), and transmission line 210.

The pump device 1310 produces the respective pump signal 1302 inputted into the directional coupler 1320. The directional coupler 1320 also receives the primary signal 101 to be amplified.

As its name suggests, the directional coupler 1320 provides coupling between the primary signal 101 and the pump signal 1302.

During operation, the directional coupler 1320 derives the input 205 (such as a single) based on the primary signal 101 in the pump signal 1302. For example, the primary signal 101 can be configured to modulate the receives pump signal 1302 to produce the input 205. Thus, the transmission line 210 and corresponding circuitry 250 receive the input 205 and convert the input 205 into the output 206. In one example, the output 206 is an amplified version of the primary signal 101. The transmission line 210 and corresponding circuitry 250 remove the pump signal 1302 on which the primary signal 101 is inputted to the input X1.

Accordingly, in this example, the transmission line 210 in FIG. 12 includes: an input node X1 operative to receive input 205 (such as an input signal) derived from a primary signal 101 and the pump signal 1302 generated by the pump device 1310. The circuitry 250 disposed in the transmission line 210 between the input node X1 and the output node Y1 includes one or more capacitor components disposed in series (see FIG. 12) as well as one or more shunt devices. The transmission line 210 corresponding circuitry 250 amplify the primary signal 101 to produce the output signal 206.

In one example, as previously discussed, the primary signal 101 modulates the pump signal 1302 (such as a carrier frequency) to produce the input 205 supplied to the input node X1. Remnants of the pump signal 1302 in the input 205 are not passed to the output node Y1.

Accordingly, one example herein includes a directional coupler 1320 that receives pump signal 1302 and the primary signal 101. The directional coupler is operative to generate the input 205 based on the primary signal 101 and the pump signal 1302. The transmission line 210 can be configured to include an input node X1 and an output node Y1. The input node X1 of the transmission line 210 is directly coupled to the directional coupler to receive the input 205. As previously discussed, the transmission line 210 includes circuitry 250 disposed between the input node and the output node. The circuitry of the transmission line 210 is configured to amplify the signal 101 into the output 206 outputted from the output node Y1.

Thus, as discussed herein, embodiments include a method comprising: receiving input 205 at an input node X1, the input being a pump signal 1302 modulated with a primary signal 101; via circuitry 250 disposed between the input node and the output node, amplifying the primary signal 101 to produce the output signal 206. As previously discussed, the circuitry 250 includes one or more capacitors disposed in series between the input node and the output node. The circuitry 250 may also include one or more Josephson junction based shunt components.

FIG. 14 is an example system diagram illustrating operation of a respective transmission line via implementation of multiple pumps as discussed herein.

As shown in FIG. 14, the system 1400 includes pump device 1310, pump device 1311, directional coupler 1320 (such as a mixer), and transmission line 210.

The pump device 1310 produces the respective pump signal 1302 (such as generated at a first carrier frequency such as 9.75 GHz or other suitable value) inputted into the combiner 1321 (such as a frequency summer). The pump device 1311 produces the respective pump signal 1303 (such as generated at a second carrier frequency such as 9.85 GHz or other suitable value) inputted into the combiner 1321. See the example as previously discussed in FIGS. 4A and 4B.

Based upon the pump signal 1302 and the pump signal 1303, the combiner 1321 produces the signal 1405 inputted to the directional coupler 1320 (such as mixer).

The directional coupler 1320 also receives the primary signal 101 to be amplified. As its name suggests, the directional coupler 1320 provides coupling between the primary signal 101 and the combination of pump signal 1302 and pump signal 1303 (received signal 1405).

During operation, the directional coupler 1320 derives the input 205-1 (such as a signal) based on the primary signal 101 and the signal 1405 (such as a combination of the pump signal 1302 and the pump signal 1303). The transmission line 210 and corresponding circuitry 250 receive the input 205-1 and convert the input 205-1 into the output 206-1. In one example, the output 206-1 is an amplified version of the primary signal 101. Note that the frequency associated with signal 1302 and signal 1303 are not transmitted from the output signal 206.

In one example, the transmission line 210 and corresponding circuitry 250 apply a gain to the primary signal 101 as indicated in FIG. 4 to produce the corresponding output signal 206. Thus, the transmission line 210 and corresponding circuitry 250 can be configured to amplify the primary signal 101 by a first gain function (see FIGS. 4A and 4B) that falls within a first frequency range R1 such as between frequency F1 and frequency F2. As shown in this example, the frequency 9.75 GHz and the frequency 9.85 GHz reside within the range R1. The minimum magnitude M1 and a respective maximum magnitude M2 of gain applied by the gain function (see FIG. 4A) in the first frequency range R1 varies by less than 3 decibels or other suitable amount. The magnitude of the first frequency range R1 (such as around 2 gigahertz wide) is at least 5 times greater or other suitable amount than a difference (such as 0.1 GHz) between the pump frequency 9.85 GHz and the pump frequency 9.75 GHz.

Note again that techniques as discussed herein are well suited for use in transmission line applications. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
an input node operative to receive input derived from a primary signal and a pump signal;
an output node operative to output an output signal; and
circuitry disposed in a circuit path extending between the input node and the output node, the circuitry including a first Josephson junction component coupled between the circuit path and a reference voltage node, the circuitry operative to amplify the primary signal to produce the output signal.

2. The apparatus as in claim 1, wherein the primary signal inputted to the input node is operative to modulate the pump signal to produce the input signal, the pump signal being a carrier frequency.

3. The apparatus as in claim 1, wherein the circuitry includes multiple capacitor components disposed in series in the circuit path extending between the input node and the output node, the multiple capacitor components including a first capacitor component and a second capacitor component.

4. The apparatus as in claim 3 further comprising:
wherein the circuit path includes a first node coupling the first capacitor component and the second capacitor component; and
wherein the first Josephson junction component is connected between the first node and the reference voltage node.

5. The apparatus as in claim 4 further comprising:
a second Josephson junction component;
wherein the circuit path includes a second node coupling the second capacitor component to a third capacitor component of the multiple capacitor components disposed in series in the circuit path; and
wherein the second Josephson junction component is coupled between the second node and the reference voltage node.

6. The apparatus as in claim 1, wherein the circuitry includes a first capacitor component disposed in series in the circuit path between the input node and the output node.

7. The apparatus as in claim 1, wherein the input node is a first input node and the output node is a first output node, the apparatus further comprising:
a second circuit path extending between a second input node and a second output node, the second circuit path being the reference voltage node.

8. A system comprising:
a directional coupler operative to receive a first signal and a second signal, the directional coupler operative to generate a third signal based on the first signal and the second signal;
a transmission line including an input node and an output node, the input node of the transmission line coupled to the directional coupler to receive the third signal; and wherein the transmission line includes circuitry disposed in a circuit path extending between the input node and the output node, the circuitry including a first Josephson junction component coupled between the circuit path and a reference voltage node, the circuitry operative to amplify the first signal into a fourth signal outputted from the output node.

9. The system as in claim 8 further comprising:
a first pump device operative to produce the second signal, the second signal being a pump signal; and
wherein the directional coupler is operative to provide coupling between the first signal and the second signal to generate the third signal, the first signal modulating the second signal to produce the third signal.

10. The system as in claim 8 further comprising:
a first pump device operative to produce a fifth signal, the fifth signal being a first pump signal;
a second pump device operative to produce a sixth signal, the sixth signal being a second pump signal;
a combiner operative to produce the second signal based on the fifth signal and the sixth signal.

11. The apparatus as in claim 10, wherein the first pump device is operative to produce the fifth signal at a first frequency;
wherein the second pump device is operative to produce the sixth signal at a second frequency; and
wherein the second frequency is greater than the first frequency.

12. The apparatus as in claim 11, wherein a zero dispersion frequency associated with the transmission line is centered about the first frequency and the second frequency.

13. The apparatus as in claim 11, wherein the transmission line is operative to amplify the first signal by a first gain function in a first frequency range; and
wherein the first frequency and the second frequency fall within the first frequency range.

14. The apparatus as in claim 13, wherein a respective minimum magnitude and a respective maximum magnitude of gain applied by the gain function in the first frequency range varies by less than 3 decibels.

15. The apparatus as in claim 14, wherein the magnitude of the first frequency range is at least 5 times greater than a difference between the second frequency and the first frequency.

16. A method comprising:
receiving an input at an input node of a transmission line, the input being a pump signal modulated with a primary signal;
via circuitry disposed in a circuit path between the input node and an output node of the transmission line, amplifying the primary signal to produce an output signal, the circuitry including a first Josephson junction component coupled between the circuit path and a reference voltage node of the transmission line; and
outputting the output signal from the output node.

17. An apparatus comprising:
an input node operative to receive input derived from a primary signal and a pump signal;
an output node operative to output an output signal; and
circuitry disposed in a transmission line between the input node and the output node, the circuitry including a capacitor component disposed in series in a circuit path between the input node and the output node, the circuitry operative to amplify the primary signal to produce the output signal.

18. The apparatus as in claim 17, wherein the primary signal inputted to the input node is operative to modulate the pump signal to produce the input signal, the pump signal being a carrier frequency.

19. The apparatus as in claim 17, wherein the circuitry includes multiple capacitor components disposed in series in the circuit path extending between the input node and the output node;
wherein the capacitor component is a first capacitor component; and
wherein the multiple capacitor components include the first capacitor component and a second capacitor component.

20. The apparatus as in claim 19 further comprising:
a first Josephson junction component.

* * * * *